US008604888B2

(12) United States Patent
Schoepf et al.

(10) Patent No.: US 8,604,888 B2
(45) Date of Patent: Dec. 10, 2013

(54) OSCILLATORS HAVING ARBITRARY FREQUENCIES AND RELATED SYSTEMS AND METHODS

(75) Inventors: Klaus Juergen Schoepf, Chandler, AZ (US); Reimund Rebel, Maricopa, AZ (US); Jan H. Kuypers, Cambridge, MA (US)

(73) Assignee: Sand 9, Inc., Cambridge, MA (US)

( * ) Notice: Subject to any disclaimer, the term of this patent is extended or adjusted under 35 U.S.C. 154(b) by 0 days.

(21) Appl. No.: 12/977,367

(22) Filed: Dec. 23, 2010

(65) Prior Publication Data

US 2011/0181366 A1    Jul. 28, 2011

Related U.S. Application Data

(63) Continuation-in-part of application No. 12/721,484, filed on Mar. 10, 2010.

(60) Provisional application No. 61/289,984, filed on Dec. 23, 2009.

(51) Int. Cl.
*H03L 7/06* (2006.01)
*H03B 5/30* (2006.01)
*H04B 1/16* (2006.01)

(52) U.S. Cl.
USPC ............. 331/154; 331/44; 331/18; 331/16; 455/192.1

(58) Field of Classification Search
USPC .......... 331/2, 16, 158, 18, 34, 44, 74; 455/75, 455/76, 77, 150.1, 179.1, 180.1, 182.1, 455/182.2, 182.3, 183.1, 183.2, 184.1, 455/192.1, 192.2, 192.3, 196.1, 255, 257, 455/258, 259, 260, 334, 337
See application file for complete search history.

(56) References Cited

U.S. PATENT DOCUMENTS

| 4,384,409 A |   | 5/1983 | Lao |
|---|---|---|---|
| 4,454,440 A |   | 6/1984 | Cullen |
| 4,647,881 A |   | 3/1987 | Mitsutsuka |
| 5,113,416 A |   | 5/1992 | Lindell |
| 5,129,262 A |   | 7/1992 | White et al. |
| 5,416,447 A |   | 5/1995 | Andres et al. |
| 5,630,227 A | * | 5/1997 | Bella et al. .................... 455/324 |
| 5,914,553 A |   | 6/1999 | Adams et al. |

(Continued)

FOREIGN PATENT DOCUMENTS

| EP | 0375360 A2 | 6/1990 |
|---|---|---|
| EP | 1505722 A2 | 2/2005 |

(Continued)

OTHER PUBLICATIONS

Final Office Action from U.S. Appl. No. 12/721,484 dated Jun. 14, 2013, 28 pages.

(Continued)

*Primary Examiner* — Ryan Johnson
(74) *Attorney, Agent, or Firm* — Wolf, Greenfield & Sacks, P.C.

(57) ABSTRACT

Systems and methods for operating with oscillators configured to produce an oscillating signal having an arbitrary frequency are described. The frequency of the oscillating signal may be shifted to remove its arbitrary nature by application of multiple tuning signals or values to the oscillator. Alternatively, the arbitrary frequency may be accommodated by adjusting operation one or more components of a circuit receiving the oscillating signal.

13 Claims, 15 Drawing Sheets

(56) References Cited

U.S. PATENT DOCUMENTS

| | | | |
|---|---|---|---|
| 6,124,765 A | 9/2000 | Chan et al. | |
| 6,150,748 A | 11/2000 | Fukiharu | |
| 6,154,095 A | 11/2000 | Shigemori et al. | |
| 6,175,280 B1 | 1/2001 | Lloyd et al. | |
| 6,420,816 B2 | 7/2002 | Getman et al. | |
| 6,463,266 B1* | 10/2002 | Shohara | 455/196.1 |
| 6,516,665 B1 | 2/2003 | Varadan et al. | |
| 6,522,212 B1 | 2/2003 | Kodim | |
| 6,563,387 B2 | 5/2003 | Hirano et al. | |
| 6,566,787 B2 | 5/2003 | Tsukahara et al. | |
| 6,577,040 B2 | 6/2003 | Nguyen | |
| 6,636,121 B2 | 10/2003 | Barak et al. | |
| 6,639,957 B2 | 10/2003 | Cahill-O'Brien et al. | |
| 6,739,190 B2 | 5/2004 | Hsu et al. | |
| 6,757,527 B1 | 6/2004 | Dahlback et al. | |
| 6,788,159 B2 | 9/2004 | Takahashi et al. | |
| 6,816,716 B2 | 11/2004 | Shohara | |
| 6,828,713 B2 | 12/2004 | Bradley et al. | |
| 6,831,531 B1 | 12/2004 | Giousouf et al. | |
| 6,848,295 B2 | 2/2005 | Auner et al. | |
| 6,859,113 B2 | 2/2005 | Giousouf et al. | |
| 6,909,221 B2 | 6/2005 | Ayazi et al. | |
| 6,943,484 B2 | 9/2005 | Clark et al. | |
| 6,954,020 B2 | 10/2005 | Ma et al. | |
| 6,995,622 B2 | 2/2006 | Partridge et al. | |
| 7,003,027 B2 | 2/2006 | Lai et al. | |
| 7,005,946 B2 | 2/2006 | Duwel et al. | |
| 7,123,670 B2* | 10/2006 | Gilbert et al. | 375/344 |
| 7,211,926 B2 | 5/2007 | Quevy et al. | |
| 7,215,061 B2 | 5/2007 | Kihara et al. | |
| 7,221,233 B2 | 5/2007 | Brennan et al. | |
| 7,221,921 B2* | 5/2007 | Maligeorgos et al. | 455/260 |
| 7,248,128 B2 | 7/2007 | Mattila et al. | |
| 7,324,789 B2 | 1/2008 | Jensen | |
| 7,352,608 B2 | 4/2008 | Mohanty et al. | |
| 7,471,028 B2 | 12/2008 | Onozawa | |
| 7,482,888 B1 | 1/2009 | Kleveland | |
| 7,492,241 B2 | 2/2009 | Piazza et al. | |
| 7,504,909 B2 | 3/2009 | Tada | |
| 7,535,152 B2 | 5/2009 | Ogami et al. | |
| 7,541,878 B2 | 6/2009 | Haiut | |
| 7,562,581 B2 | 7/2009 | Garverick et al. | |
| 7,583,705 B2 | 9/2009 | Sinha et al. | |
| 7,724,103 B2 | 5/2010 | Feng et al. | |
| 7,728,483 B2 | 6/2010 | Tanaka | |
| 7,755,443 B2 | 7/2010 | Osman et al. | |
| 7,791,432 B2 | 9/2010 | Piazza et al. | |
| 7,804,369 B2 | 9/2010 | Saunders | |
| 7,929,594 B2 | 4/2011 | Okazaki et al. | |
| 8,031,024 B1 | 10/2011 | Zaslavsky | |
| 8,122,587 B2* | 2/2012 | Kawashima | 29/594 |
| 8,228,127 B2 | 7/2012 | Rebel et al. | |
| 8,319,566 B2 | 11/2012 | Rebel et al. | |
| 8,446,227 B2 | 5/2013 | Rebel et al. | |
| 8,456,250 B2 | 6/2013 | Locascio et al. | |
| 2002/0158700 A1 | 10/2002 | Nemoto | |
| 2003/0034852 A1 | 2/2003 | Kobayashi et al. | |
| 2004/0056728 A1 | 3/2004 | Dent et al. | |
| 2005/0073078 A1 | 4/2005 | Lutz et al. | |
| 2006/0111141 A1* | 5/2006 | Smith et al. | 455/553.1 |
| 2008/0048804 A1 | 2/2008 | Volatier et al. | |
| 2008/0143217 A1 | 6/2008 | Ho et al. | |
| 2008/0150645 A1 | 6/2008 | McCorquodale et al. | |
| 2008/0204153 A1 | 8/2008 | Yoshida et al. | |
| 2008/0272852 A1 | 11/2008 | Six | |
| 2009/0026882 A1 | 1/2009 | Steeneken et al. | |
| 2009/0108381 A1 | 4/2009 | Buchwalter et al. | |
| 2009/0108959 A1 | 4/2009 | Piazza et al. | |
| 2009/0144963 A1 | 6/2009 | Piazza et al. | |
| 2009/0231188 A1 | 9/2009 | Yanni et al. | |
| 2009/0243747 A1 | 10/2009 | Gaidarzhy et al. | |
| 2009/0294638 A1 | 12/2009 | Mohanty et al. | |
| 2010/0007443 A1 | 1/2010 | Mohanty et al. | |
| 2010/0026136 A1 | 2/2010 | Gaidarzhy et al. | |
| 2010/0134207 A1 | 6/2010 | Mohanty et al. | |
| 2010/0155883 A1 | 6/2010 | Wenzler et al. | |
| 2010/0181868 A1 | 7/2010 | Gaidarzhy et al. | |
| 2011/0148531 A1 | 6/2011 | Schoepf et al. | |
| 2012/0139647 A1 | 6/2012 | Schoepf et al. | |
| 2012/0163134 A1 | 6/2012 | Schoepf et al. | |
| 2012/0315866 A1 | 12/2012 | Rebel et al. | |

FOREIGN PATENT DOCUMENTS

| | | |
|---|---|---|
| WO | WO 98/01948 A1 | 1/1998 |
| WO | WO 98/37635 A1 | 8/1998 |
| WO | WO 02/17481 A2 | 2/2002 |
| WO | WO 2005/029700 A1 | 3/2005 |
| WO | WO 2006/000611 A1 | 1/2006 |
| WO | WO 2010/011288 A1 | 1/2010 |
| WO | WO 2010/077311 A1 | 7/2010 |
| WO | WO 2010/090731 A2 | 8/2010 |

OTHER PUBLICATIONS

Final Office Action from U.S. Appl. No. 13/312,220 dated Sep. 23, 2013, 13 pages.

Response to Non-final Office Action from U.S. Appl. No. 12/721,484 dated May 24, 2013, 17 pages.

Non-final Office Action from U.S. Appl. No. 13/312,220 dated Apr. 5, 2013, 10 pages.

Driscoll, M.M., "Linear Frequency Tuning of Saw Resonators," *IEEE Trans. on Ultrasonics, Ferroelectrics and Frequency Control* 38(4):366-369 (Jul. 1, 1991).

Driscoll et al., "Voltage-controlled crystal oscillators," *IEEE Trans. on Electron Devices* ED-18(8):528-535 (Aug. 1971).

Humad et al., "High frequency micromechanical piezo-on-silicon block resonators," Int'l Electron Devices Meeting 2003IEDM. Technical Digest, Washington, D.C. Dec. 8-10, 2003, New York, NY: IEEE US Dec. 8, 2003, pp. 957-960.

International Search Report and International Preliminary Report on Patentability for PCT/US2006/021298 mailed Nov. 6, 2006 and Dec. 6, 2007 respectively.

International Search Report and Written Opinion from International Application No. PCT/US2010/061982, mailed May 3, 2011.

International Search Report and Written Opinion from International Application No. PCT/US2010/000301 mailed Sep. 3, 2010.

Piazza et al., "Low motional resistance ring-shaped contour-mode aluminum nitride piezoelectric micromechanical resonators for UHF applications," Micro Electro Mechanical Systems, 2005. MEMS 2005. 18th IEEE International Conference on Miami Beach, Florida, Jan. 30-Feb. 3, 2005, Piscataway, New Jersey, US, IEEE Jan. 30, 2005, pp. 20-23.

Volkar, M., "Tuning and Control of an On-Chip Piesoelectric Resonator", Master's Thesis, University of Pittsburgh, 2002.

\* cited by examiner

OSCILLATORS HAVING ARBITRARY FREQUENCIES AND RELATED SYSTEMS AND METHODS

RELATED APPLICATIONS

This application claims the benefit under 35 U.S.C. §119(e) of U.S. Provisional Patent Application Ser. No. 61/289,984, filed on Dec. 23, 2009 and entitled "Oscillators Having Arbitrary Frequencies and Related Systems and Methods", which application is hereby incorporated herein by reference in its entirety.

This application also claims the benefit under 35 U.S.C. §120 as a continuation-in-part (CIP) of U.S. patent application Ser. No. 12/721,484, filed on Mar. 10, 2010 and entitled "Oscillators Having Arbitrary Frequencies and Related Systems and Methods," which application is hereby incorporated herein by reference in its entirety. Patent application Ser. No. 12/721,484 in turn claims the benefit under 35 U.S.C. §119(e) of U.S. Provisional Patent Application Ser. No. 61/289,984, filed on Dec. 23, 2009 and entitled "Oscillators Having Arbitrary Frequencies and Related Systems and Methods", which application is hereby incorporated herein by reference in its entirety.

BACKGROUND

1. Field

The technology described herein relates to oscillators providing oscillating signals having arbitrary frequencies and to systems and methods for using the same.

2. Related Art

Oscillators are ubiquitous components in electronic equipment including wireless and wireline communications systems, entertainment electronics, aerospace systems, and timing systems. The oscillators traditionally are used to provide a reference signal or clock signal, such that precision of the signal frequency is important. Conventionally, crystal oscillators having quartz crystals as the resonating element have served as the oscillators of choice because they can be manufactured to provide precise signal frequencies within ±1.5 parts-per-million (ppm) of a target frequency value, frequency stabilities of ±2.5 ppm over the entire operating temperature range from −40° C. to +85° C., aging of below ±1 ppm/year (at 25° C.), typical phase noise of −138 dBc/Hz at 1 kHz, and power consumption as low as 1.5 mA.

Standard frequencies for reference signals and clock signals have developed, and oscillator manufacturing has conformed to these standard frequencies. Typical frequency values are as low as 32.768 kHz for watch crystals and real time clocks. Frequencies in the MHz range are commonly used in cell phones and GPS receivers, including 12.6 MHz, 13 MHz, 14.4 MHz, 16 MHz, 16.368 MHz, 16.9 MHz, 19.2 MHz, 19.8 MHz, 20 MHz, 23.104 MHz, 24.554 MHz, 26 MHz, 27.456 MHz, 32 MHz, 33.6 MHz, 38.4 MHz, and 52 MHz. Owing to the ability to manufacture quartz crystals to provide a precise target frequency, it is conventional for crystal oscillators to be manufactured to provide one of the several standard frequencies.

Thus, circuits and systems including crystal oscillators or receiving signals from crystal oscillators are conventionally designed to work with one of the standard frequencies corresponding to the particular crystal oscillator being used. FIG. 1A illustrates a conventional apparatus 100 including an oscillator 102 and system 106 that receives at its input port 105 an oscillator signal 104 output from an output port 103 of the oscillator 102. The system 106 is designed to work with a signal of precisely 26 MHz. Therefore, a 26 MHz oscillator is selected for the oscillator 102. If the system 106 receives a different frequency, it will not operate properly.

In some conventional devices, circuitry is designed to operate with a frequency other than that provided by the oscillator, but which can be precisely generated from a known, precise oscillator frequency conforming to one of the standard frequencies. Referring to FIG. 1B, the apparatus 150 includes the previously described oscillator 102 and a system 156, which itself includes a frequency synthesizer 158 and a sub-system 162. The sub-system 162 is designed to operate with a frequency other than the 26 MHz of oscillator signal 104 provided by the oscillator 102. The frequency synthesizer receives the oscillator signal 104 at its input port 155 and generates a synthesized signal 160, which can be referred to as an internal signal since it is generated and used internally to system 156, having the frequency required by sub-system 162. If the synthesizer 158 does not receive a precise 26 MHz signal from the oscillator, it will not generate the precise frequency required by subsystem 162, and therefore the sub-system 162 will not operate properly.

In the event that an oscillator does not provide a frequency precisely matching that required by a system, some conventional devices include circuitry to provide a tuning signal to the oscillator, referred to as automatic frequency control (AFC), as shown in FIGS. 2A and 2B. The apparatus 200 of FIG. 2A includes a 26 MHz oscillator 202 which provides the oscillator signal 104 to a system 206. Although the oscillator 202 is shown as a 26 MHz oscillator, for conventional oscillators the oscillator signal 104 can differ from 26 MHz by ±2 ppm. The system 206 determines whether the oscillator signal 104 has a frequency of precisely 26 MHz, and includes an output port 208 from which is provided an AFC tuning signal 210 to tune the oscillator if the oscillator signal 104 is not precisely 26 MHz. The AFC tuning signal 210 is received at an electronic frequency control input port (EFC_tune) 204 of the oscillator.

In FIG. 2B, the apparatus 250 includes the 26 MHz oscillator 202 and a system 256 having an input terminal 255 to receive the oscillator signal 104. The frequency synthesizer 258 generates a synthesized, or internal, signal 212 which is provided to the subsystem 262. The subsystem 262 detects whether the synthesized signal has the precise frequency required for proper operation of the sub-system and provides, via output port 264, the AFC tuning signal 210 to tune the oscillator 202 if the frequency of synthesized signal 212 does not precisely match the required frequency.

Conventional AFC tuning is limited to ±30 ppm of an initial frequency by the properties of the quartz crystals used as the resonating elements of conventional crystal oscillators, and is typically limited to ±10 ppm in practice.

SUMMARY

According to one aspect of the present invention, an oscillator is configured to produce an oscillating signal of arbitrary frequency. The oscillator may include a mechanical resonator. In some embodiments, a system may include the oscillator.

According to another aspect of the present invention, a circuit comprises a reference clock. The reference clock comprises a reference oscillator configured to produce a reference oscillator signal having an arbitrary frequency that is not a power of 2. The reference clock further comprises counter circuitry configured to receive the reference oscillator signal and count a number of oscillations of the reference oscillator signal. The reference clock is configured to output a reference clock signal with a time base based on the number of oscillations of the reference oscillator signal counted by the counter circuitry. The circuit further comprises a real time clock coupled to the reference clock and configured to receive the reference clock signal having the time base, and configured to produce an output indicative of current time.

According to another aspect of the present invention, a circuit comprises a tunable reference oscillator configured to produce a tunable reference oscillating signal, and a real time clock configured to receive a reference clock signal derived from the tunable reference oscillating signal and produce an output indicative of current time.

According to another aspect of the present invention, a method of operating clock circuitry comprises generating a reference oscillating signal having an arbitrary frequency that is not a power of 2, counting a number of oscillations of the reference oscillating signal, and producing a reference clock signal based on the number of oscillations of the reference oscillating signal counted. The method further comprises providing the reference clock signal to a real time clock, and generating an output of the real time clock indicative of current time.

BRIEF DESCRIPTION OF THE DRAWINGS

Description of various aspects and embodiments of the invention will be given by reference to the following drawings. The drawings are not necessarily drawn to scale. Each identical or nearly identical component illustrated in multiple drawings is illustrated by a like numeral.

DETAILED DESCRIPTION

Figure 1A:
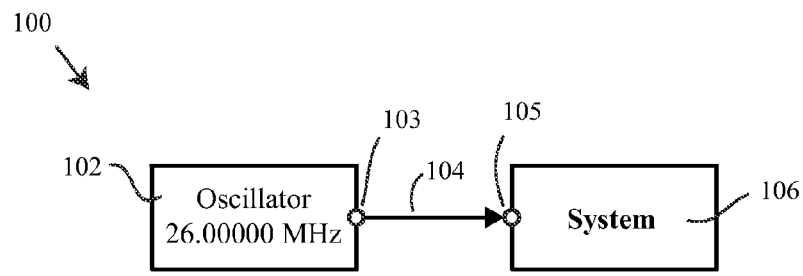
FIG. 1A illustrates a conventional configuration of an oscillator providing to a system an oscillating signal having a standard frequency.

While, as described above, conventional quartz crystal resonators can be manufactured to provide an oscillating signal of precise frequency, doing so requires significant effort and cost. Accordingly, Applicants have appreciated that the effort and cost associated with manufacturing conventional quartz crystal resonators may be minimized or eliminated by designing systems which may accurately operate in combination with an oscillator manufactured to produce an arbitrary frequency rather than a conventionally accepted (standard) oscillator frequency. As used herein, "arbitrary frequency" refers to a frequency not substantially matching a conventional standard oscillator frequency. For example, the arbitrary frequency may differ by at least 30 parts per million (ppm) from a standard oscillator frequency in some embodiments. In some embodiments, the arbitrary frequency may differ by at least 50 ppm from a standard oscillator frequency, by at least 100 ppm, by at least 200 ppm, by at least 500 ppm, by at least 1,000 ppm, or by between approximately 1,000 ppm and 10,000 ppm (e.g., 2,000 ppm, 5,000 ppm, or any other value within this range), among other possible amounts of deviation. The term "arbitrary frequency" as used herein does not imply the frequency is not known or cannot be measured. Rather, an arbitrary frequency may be measured or otherwise have its value determined.

Furthermore, systems as described herein which may accurately operate (i.e., be workable) in combination with an oscillator manufactured to produce an oscillating signal of arbitrary frequency may enable the use of mechanical resonator technologies which cannot be manufactured with the precision of conventional quartz crystal resonators, but which may offer various advantages over quartz crystal resonator technology. For example, oscillators employing MEMS resonator technology may not be easily manufactured to conform to one of the standard oscillator frequencies, but rather may be manufactured with less precision to provide an arbitrary frequency, thus making them less desirable than quartz crystal resonators for many present day applications in which a frequency precisely matching a conventional standard oscillator frequency is required. However, oscillators employing MEMS resonator technology may offer benefits compared to conventional quartz crystal resonators in terms of, for example, frequency stability, ease of manufacturing, manufacturing compatibility of the materials of the oscillator and/or mechanical resonator, cost, or other beneficial characteristics. Accordingly, it may be desirable to use oscillators employing MEMS resonator technology for some applications. One or more of the aspects of the invention described herein may enable or facilitate use of such technologies.

Accordingly, aspects of the present invention provide oscillators configured to produce oscillating signals having arbitrary frequencies and related systems and methods which may properly operate in connection with such oscillators. For purposes of the following discussion, the described systems and methods may be grouped into one of two classes, although it should be appreciated that the classes are not necessarily mutually exclusive and may overlap in one or more embodiments. The first class includes systems and methods which generate, from an oscillator configured to produce an oscillating signal of arbitrary frequency or from the oscillating signal of arbitrary frequency, an oscillating signal having a standard oscillator frequency. For example, the arbitrary frequency may differ from a standard oscillator frequency (e.g., 26 MHz) by up to ±10,000 ppm or more, and the systems and methods according to the first class discussed herein may generate from the oscillator or the oscillating signal of arbitrary frequency a signal having the standard frequency. A second class of systems and methods described herein are those which operate with a received oscillator signal of arbitrary frequency and do not shift the oscillator signal to a standard frequency, but rather adapt the configuration and/or operation of one or more components of the system to account for the arbitrary frequency.

Thus, according to one aspect of the present invention, a method of generating an oscillating signal having a target frequency (e.g., a standard oscillator frequency) from an oscillator having a mechanical resonator and configured to provide an arbitrary frequency is provided. A first tuning signal may be applied to the oscillator to shift a frequency of the oscillating signal produced by the oscillator. The method may further involve applying an automatic frequency control (AFC) tuning signal to the oscillator. The first tuning signal and the AFC tuning signal may have different values, and may form distinct signals in some embodiments. In alternative embodiments, the first tuning signal and the AFC tuning signal may form different components of a single signal. As will be described further below, the first tuning signal may influence a larger frequency shift of the oscillating signal output by the oscillator than the AFC tuning signal. Thus, the first tuning signal may be thought of as a coarse tuning signal, while the AFC tuning signal may operate as a fine tuning signal in some embodiments.

According to another aspect of the present invention, a circuit or system coupled to an oscillator and configured to receive an oscillating signal from the oscillator is configured to apply multiple tuning signals to the oscillator to control a frequency of the oscillating signal output by the oscillator. The oscillator may include a mechanical resonator of any suitable resonating technology, including MEMS technology, quartz crystal resonator technology, or any other suitable mechanical resonating technology. According to some embodiments, the circuit or system is configured to apply two tuning signals to the oscillator. One of the tuning signals may correspond to an AFC tuning signal, and the other tuning signal may be distinct from the AFC tuning signal and may represent a "frequency steering" signal, as described further below. The tuning signals may be provided separately, or in some embodiments may be provided as different components of a same signal. The value of the AFC tuning signal may influence a relatively small frequency shift of the oscillating signal output by the oscillator, whereas the additional frequency steering tuning value may influence a relatively larger frequency shift of the oscillating signal. The values of the AFC tuning signal and the additional tuning signal may be selected to shift the frequency of the oscillating signal output by the oscillator from an arbitrary frequency to a desired standard oscillator frequency.

According to some embodiments of the above-described aspects of the present invention, the values of one or both of the tuning signals may be determined at least in part based on the arbitrary frequency of the oscillating signal output by the oscillator. The value of the arbitrary frequency may be determined in various suitable manners, and may be provided to the appropriate circuitry within the oscillator and/or circuit or system operating in connection with the oscillator in any suitable manner. According to one aspect of the present invention, an oscillator including a mechanical resonator also includes memory storing a value indicative of a frequency of the oscillator and/or the mechanical resonator. The value stored in memory of the oscillator and indicative of the frequency of the oscillator and/or mechanical resonator may be provided to a circuit or system operating in connection with the oscillator, for example in addition to the oscillating output signal itself. Thus, according to one aspect of the present invention, an oscillator outputs an oscillating output signal having an arbitrary frequency as well as value indicative of the arbitrary frequency.

As mentioned, a second class of systems and methods according to the various aspects of the invention described herein are those which operate with a received oscillator signal of arbitrary frequency and do not shift the oscillator signal to a standard oscillator frequency, but rather adapt the configuration and/or operation of one or more components of the system to account for the arbitrary frequency. According to one such aspect of the present invention, a method is provided for operating on a cellular telephone signal using an oscillating reference signal having an arbitrary frequency. The cellular telephone signal may be down-converted to an intermediate frequency using the oscillating reference signal of arbitrary frequency, resulting in a down-converted signal including data corresponding to the data of the cellular telephone signal. As a result of performing the down-conversion with an oscillating reference signal of arbitrary frequency, the data of the down-converted signal may be shifted in the frequency domain relative to the intermediate frequency. The down-converted signal may then be sampled with an analog-to-digital converter (ADC). The sampling rate of the ADC may be selected to induce a shift in the frequency domain of the data of the down-converted signal to compensate for the shift of the data of the down-converted signal from the intermediate frequency.

According to another such aspect of the invention, the sampling rate of a digital-to-analog converter (DAC) in a transmit path of a device, such as a cellular telephone or other transmission device, may be selected to account for an up-conversion process performed in the transmit path using an oscillating reference signal having an arbitrary frequency. The up-conversion process may be performed by suitable mixing of an analog signal including analog data, such as a cellular telephone signal or other analog signal to be transmitted, with an oscillating reference signal, resulting in an up-converted signal at a desired carrier frequency. The analog signal itself may be generated by performing digital-to-analog conversion of a digital signal having the desired data for transmission. The transmit path may be designed to operate with an oscillating reference signal having a standard oscillator frequency, such that if the oscillating reference signal instead has an arbitrary frequency the data of the resulting up-converted signal may be shifted in the frequency domain relative to the center frequency of the desired carrier frequency. Such a shift may be accounted for by suitable selection of the sampling rate of the DAC prior to up-conversion, such that the data of the up-converted signal appears at the intermediate frequency. For example, if the arbitrary frequency of the oscillating reference signal is higher than an expected standard oscillator frequency, then the sampling rate of the DAC may be selected to be lower than if the oscillating reference signal had the expected standard oscillator frequency, and vice versa.

According to another such aspect of the present invention, a method of accounting for down-conversion of a received signal using an oscillating reference signal of arbitrary frequency may comprise using a digital signal processor (DSP) to digitally shift the data of the down-converted signal in the frequency domain. A carrier signal modulated with data may be received and down-converted using the oscillating reference signal of arbitrary frequency, thus resulting in a down-converted signal including data corresponding to the data modulated on the carrier signal. The down-converted signal may then be sampled using an ADC to produce a digital signal including digital data corresponding to the data modulated on the carrier signal. Because the down-conversion of the carrier signal is performed using an oscillating reference signal having an arbitrary frequency, the digital data of the resulting down-converted and digitized signal may be shifted in the frequency domain relative to the baseband frequency and/or intermediate frequency. Accordingly, the digitized signal output by the ADC may be provided to a DSP, which may digitally shift the data of the digitized signal in the frequency domain.

According to another such aspect of the present invention, a digital shift of data to be transmitted from a transmit path of a device, such as a cellular telephone or other transmission device, may be induced to account for an up-conversion process performed using a reference oscillating signal having an arbitrary frequency. A digital data signal having digital data to be transmitted may be generated. The digital data signal may be digital-to-analog converted using a DAC and then up-converted by mixing with a suitable oscillating reference signal. The device may be designed in expectation of the oscillating reference signal having a standard oscillator frequency. In the event the oscillating reference signal has an arbitrary frequency, the up-conversion process may result in the data to be transmitted being shifted in the frequency domain relative to the center frequency of the intended carrier frequency. To account for such a shift, a digital signal processor (DSP) may be used to shift, in the frequency domain, the digital data of the digital data signal prior to the digital-to-analog conversion. By suitable selection of the amount of frequency shift to induce in the digital data signal, the subsequent DAC conversion and up-conversion using an oscillating reference signal of arbitrary frequency may result in the data of the up-converted signal appearing at a desired frequency or frequencies (e.g., near the center frequency of the desired carrier frequency).

According to a further such aspect of the present invention, a method of operating on a signal down-converted using an oscillating reference signal having an arbitrary frequency comprises utilizing a carrier tracking loop. A carrier signal modulated with data may be received and down-converted using the oscillating reference signal of arbitrary frequency, resulting in a down-converted signal. The down-converted signal may then be sampled with an ADC, producing a digital signal including digital data corresponding to the data modulated on the carrier signal. The sampling rate of the ADC may be selected as if the oscillating reference signal had a standard oscillator frequency and not an arbitrary frequency. For example, the sampling rate of the ADC may be selected as if the oscillating reference signal had a standard oscillator frequency of, for example, 26 MHz, rather than an arbitrary frequency differing from the standard operating frequency by up to approximately ±10,000 ppm. As a result, the digitized signal may include digital data not accurately reflecting the data modulated on the carrier signal. The digitized signal may be applied to a carrier tracking loop, thus effectively re-sampling the digital data of the digital signal to restore its accuracy.

According to another aspect of the present invention, circuits and methods using an arbitrary frequency reference oscillator in combination with a real time clock are described. The arbitrary frequency reference oscillator may generate an arbitrary frequency signal whose frequency is not a power of 2. A reference clock signal having a desired time base may be generated from the arbitrary frequency signal by counting a number of oscillations of the arbitrary frequency signal. The reference clock signal may then be provided to a real time clock which may generate an output indicative of current time. In some embodiments, the arbitrary frequency reference oscillator may be frequency tunable, and frequency tuning may be performed to account for temperature induced fluctuations in the frequency of operation. In some embodiments, the arbitrary frequency reference oscillator may be frequency tunable, and the frequency tuning may be performed to set the frequency of the reference oscillator to an integer fraction of the desired time base of the reference clock signal, which may simplify operation of the counter in some embodiments. As a non-limiting example, an arbitrary frequency oscillator with an output frequency of 127,123.456 Hz, may be tuned to 127,123 Hz to reduce the complexity of the counter by allowing for use of an integer based counter.

The various aspects described above, as well as further aspects, will now be described in further detail below. It should be appreciated that these aspects may be used alone, all together, or in any combination of two or more, to the extent that they are not mutually exclusive. Also, while various of the aspects will be described below in the context of cellular telephone systems, it should be appreciated that the aspects are not limited in this respect, and may apply to other devices and systems which use a reference oscillator, such as navigation receivers (e.g., global positioning system (GPS) receivers), personal digital assistants (PDAs), other wireless communication devices, timing circuits, or other devices using reference oscillators.

Figure 3:
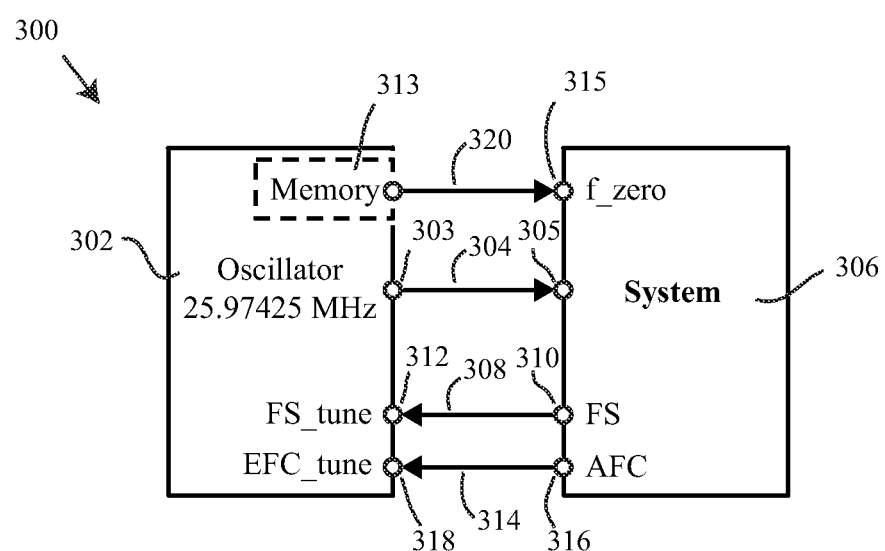
FIG. 3 illustrates in block diagram form an apparatus comprising a system coupled to an oscillator configured to generate an oscillating signal having an arbitrary frequency, according to one embodiment of the present invention.

As mentioned, according to one class of systems and methods described herein, an oscillating signal having a standard oscillator frequency is generated from an oscillator configured to produce an oscillating signal of arbitrary frequency. One non-limiting example of a system and method for doing so is to provide multiple tuning signals (which may involve, in some instances, providing multiple tuning values) to the oscillator. An example of an apparatus according to this aspect of the present invention is illustrated in FIG. 3.

As shown, the apparatus 300 includes an oscillator 302 and a system 306. According to one embodiment, the oscillator and system may be formed on separate semiconductor dies (which may facilitate separate manufacture of the two), although not all embodiments are limited in this respect. The oscillator 302 is configured to provide from an output port 303 an oscillating output signal 304. The oscillating output signal 304 is received by an input port 305 of the system 306. As shown, the oscillator 302 may be configured (e.g., by its manufacture) to produce a signal of, as a non-limiting example, 25.97425 MHz, or in other words an arbitrary frequency. The system 306 may be configured to operate with a precise standard oscillator frequency, such as, for example, 26 MHz, such that the 25.97425 MHz which oscillator 302 is configured to produce is not suitable for proper operation of the system 306. Accordingly, to work with the oscillator 302, the system 306 may be configured to provide two tuning signals to the oscillator 302 to influence the frequency of the oscillating output signal 304, and in some embodiments to control the frequency of the oscillating output signal 304 to have it match a standard oscillator frequency.

As shown, a first tuning signal 308 is provided from a first output port 310 of the system 306 to a first input port 312 of the oscillator 302. An AFC tuning signal 314 is also provided from an output port 316 of the system 306 to a second input port 318 of the oscillator 302. As will be described further below, the values of the tuning signal 308 and the AFC tuning signal 314 may be selected to tune the oscillator 302 such that the oscillating output signal 304 has a standard oscillator frequency rather than the arbitrary frequency which oscillator 302 is configured to produce, or so that the oscillating output signal has a frequency enabling the system 306 itself to generate from the oscillating output signal 304 an oscillating signal (e.g., an internal signal) having a desired standard oscillator frequency.

According to one embodiment, a combination of tuning signal 308 and AFC tuning signal 314 may induce a frequency shift of up to approximately ±10,000 ppm (e.g., up to approximately ±500 ppm, ±1,000 ppm, ±2,000 ppm, ±5,000 ppm, or any other suitable amount) of the oscillating output signal 304, or any other suitable amount. Thus, a large frequency shift of the oscillating output signal 304 may be realized by use of tuning signals 308 and 314, enabling or facilitating use of an oscillator 302 configured to produce an arbitrary frequency with the system 306. According to one embodiment, the value of tuning signal 308 induces a relatively larger frequency shift of the oscillating output signal 304 than does the AFC tuning signal 314. Thus, the tuning signal 308 may be thought of as a coarse adjustment tuning signal, and is referred to herein as a "frequency steering" signal (which is why output port 310 is labeled "FS" and input port 312 is labeled "FS_tune"), while the AFC tuning signal may be thought of as a fine adjustment tuning signal. According to one embodiment, the AFC tuning signal induces a relatively small frequency shift of the oscillating output signal 304 of, for example, less than approximately ±5 ppm, less than approximately ±10 ppm, or less than approximately ±20 ppm, as a continuous value or in increments of any suitable size. Thus, it should be appreciated that the tuning signal 308 may induce a substantially larger frequency shift, for example, up to approximately ±10,000 ppm according to some embodiments. The tuning signal 308 may induce a frequency shift of certain distinct values in increments of ±50 ppm, ±100 ppm, ±200 ppm, or any other suitable amount.

The form of tuning signals 308 and 314, and the manner and timing in which they are provided to the oscillator 302, are not limiting. According to one embodiment, the form of tuning signal 308 may depend on a type of tuning technique used to tune oscillator 302. For example, according to one embodiment the oscillator 302 may be tunable by inducing a phase shift between an output signal of the oscillator and an input signal of the oscillator, for example if the oscillator comprises or is part of a feedback loop. An example of such a device with which the aspects described herein may be applied is described in co-pending U.S. patent application Ser. No. 12/699,094, filed Feb. 8, 2010, entitled "Methods and Apparatus for Tuning Devices Having Mechanical Resonators", and published as U.S. Patent Application Publication No. 2010-0308927-A1, which application is hereby incorporated herein by reference in its entirety. In such an embodiment, the tuning signal 308 may be any signal suitable for selecting or inducing a desired amount of phase shift. According to another embodiment, the oscillator 302 may be tunable by inducing a phase shift and an amplitude shift between an output signal of the oscillator and an input signal to the oscillator, for example again if the oscillator comprises or forms part of a feedback loop. Examples of such devices are also described in U.S. patent application Ser. No. 12/699,094. In such a non-limiting embodiment, tuning signal 308 may be any signal suitable for selecting or inducing a desired amount of phase shift and/or amplitude adjustment. Other tuning techniques for tuning the oscillator 302 are also possible, and tuning signal 308 may take any suitable form for dictating or selecting the amount of frequency shift by which to shift the frequency of the oscillating output signal provided by the oscillator.

According to one embodiment, the value of tuning signal 308 may be a digital value which may effectively program the oscillator 302, thus inducing a frequency shift of the oscillating output signal 304. For example, in one embodiment the oscillator 302 may be tunable by inducing a phase shift between an output signal and input signal of the oscillator, and the tuning signal may be a digital value indicating an amount of phase shift to induce. According to one such embodiment, the tuning signal 308 may be a digital code, which may be decoded (e.g., by suitable decoding circuitry of the oscillator) to determine an amount of phase shift to induce. It should be appreciated that digital codes may similarly be used with oscillators tuned by different tuning techniques (e.g., other than by inducing a phase shift between input and output signals of the oscillator).

The tuning signal 308 may be provided once (e.g., upon powering on of the system 306) to the oscillator 302, at periodic intervals, when a device of which apparatus 300 forms a part changes a frequency of operation (e.g., when a cell phone changes frequency channels), substantially continuously, or at any other suitable time. According to an alternative embodiment, the tuning signal 308 may be an analog tuning voltage applied at any of the above-described times or any other suitable time. According to one embodiment, the value of the frequency steering signal may be stored in local memory of the oscillator upon receipt from the system.

The AFC tuning signal 314 provided to input port 318 (labeled as "EFC_tune") may be substantially the same as a conventional AFC tuning signal, and therefore may be either an analog tuning voltage or a digital signal, as the various aspects described herein implementing an AFC tuning signal are not limited to the form of the tuning signal unless otherwise stated. The AFC tuning signal 314 may be applied continuously to the system 302, for example as an analog tuning voltage, and may vary regularly to account for relatively small deviations of the frequency of oscillating output signal 304 from a target frequency. Other forms and timing of application are also possible for AFC tuning signal 314.

As mentioned, the manner in which the tuning signals 308 and 314 are provided to oscillator 302 is also not limiting.

According to one embodiment, as shown in FIG. 3, tuning signals 308 and 314 may be provided as distinct signals to the oscillator (e.g., on separate wire leads or signal traces). According to another embodiment, tuning signals 308 and 314 may be provided as a single signal (e.g., on a single wire lead or signal trace) to the oscillator. In such an embodiment, the tuning signals 308 and 314 may represent different components or portions of a single tuning signal. Thus, it should be appreciated that the form and manner of applying tuning signals 308 and 314 to the oscillator are not limiting.

While the oscillator 302 is not limited to utilizing any particular type of mechanical resonator technology, and therefore may utilize conventional quartz crystal resonator technology, MEMS resonator technology, or any other suitable technology, it should be appreciated that the amount of frequency shift which may be induced by the combination of tuning signal 308 and AFC tuning signal 314 may be limited at least in part by the type of resonator technology employed. For example, conventional quartz crystal resonator technology may not allow for tuning up to approximately ±10,000 ppm of the initial oscillator output signal frequency. Thus, it should be appreciated that those embodiments described herein relating to tuning of an oscillator output signal frequency by up to approximately ±10,000 ppm may correspond to embodiments in which the oscillator employs mechanical resonator technology allowing for such a relatively large tuning range. According to one embodiment, MEMS resonator technology, such as that described in U.S. patent application Ser. No. 12/181,531, filed Jul. 29, 2008, entitled "Micromechanical Resonating Devices and Related Methods" and published as U.S. Patent Application Publication No. 2010-0026136-A1, and U.S. patent application Ser. No. 12/142,254, filed Jun. 19, 2008, entitled "Methods and Devices For Compensating a Signal Using Resonators" and published as U.S. Patent Application Publication No. 2009-0243747-A1, may be employed, both of which applications are hereby incorporated herein by reference in their entireties.

The system 306 may include any suitable circuitry for providing the tuning signals 308 and 314, and may include any suitable circuitry for determining the values of those signals. According to one aspect of the present invention, the system 306 may determine suitable values for tuning signals 308 and 314 by comparison of the frequency of the oscillating output signal 304 to a reference frequency, such as a radio frequency signal of known frequency received by a device of which apparatus 300 forms a part (e.g., a cellular telephone). For example, according to one embodiment, the system 306 receives the oscillating output signal 304 having the initially arbitrary frequency and compares the received oscillating signal to a reference signal having a known frequency, which may correspond to a target frequency. If the system 306 determines that the oscillating output signal 304 does not have the desired target frequency, the frequency difference between that of the oscillating output signal 304 and the target frequency may be determined, and suitable values for the tuning signals 308 and 314 to adjust the arbitrary frequency of oscillating output signal 304 to the desired target frequency may be determined.

According to another embodiment, the frequency of the output signal provided by the oscillator may be directly measured, for example using a frequency analyzer or any other suitable technique. Such measurement may be made after manufacture of the oscillator or at any other suitable time. The measured frequency may be compared to a target value, from which suitable values for tuning signals 308 and 314 to adjust the arbitrary frequency of oscillating output signal 304 to the desired target frequency may be determined.

According to another embodiment, the values of one or both of tuning signals 308 and 314 may be determined based on a known value of the arbitrary frequency of oscillator 302. For example, as shown in FIG. 3, according to one embodiment the oscillator 302 provides from memory 313 a value 320 indicative of the arbitrary frequency, which may be received at an input port 315 of the system 306 (labeled as port "f_zero" since the initial arbitrary frequency of the oscillator may be labeled "f_zero"). Value 320 may be one of various values which the system 306 may use to determine appropriate values for tuning signals 308 and/or 314. For example, according to one embodiment, value 320 is a value of the frequency of oscillator 302 (e.g., 25.97425 MHz), for example, the arbitrary frequency. According to an alternative embodiment, value 320 is a value of an offset of the arbitrary frequency from a standard frequency. For example, value 320 may be 5,000 if the arbitrary frequency differs from a standard oscillator frequency of known value by 5,000 ppm. According to a further embodiment, value 320 may be a value of a frequency of the mechanical resonator of oscillator 302 (e.g., 25.99955 MHz), which may be indicative of the arbitrary frequency of oscillating output signal 304. According to another alternative embodiment, the value 320 may be a value of an offset of the frequency of the mechanical resonator of oscillator 302 from a standard oscillator frequency (e.g., value 320 may be 1,000 if the frequency of the mechanical resonator differs by 1,000 ppm from a standard oscillator frequency). Other values are also possible, as the value 320 is not limited to representing any specific physical quantity, but rather may represent one of various quantities which the system 306 may satisfactorily use to determine appropriate values for tuning signals 308 and/or 314.

More generally, according to an aspect of the present invention, at least one value indicative of the frequency of the oscillator and/or of the mechanical resonator may be provided to a system (e.g., to a synthesizer (e.g., a phase-locked loop), such as synthesizer 401 described further below or any other suitable synthesizer, or any other system) receiving the output of the oscillator from any suitable source (e.g., memory of the oscillator or any other suitable source). The at least one value may be the frequency of the oscillator/mechanical resonator, an offset of the frequency from a known frequency, or may be any other suitable indication. According to one embodiment, the at least one value may be the oscillating signal output itself, the frequency of which may be measured and provided to the receiving system. Such information may then be used to adjust the AFC tuning signal or the frequency steering signal, or both. In some embodiments, such information may be used to adjust a frequency synthesizer (e.g., a synthesizer of the types described below), for example in combination with adjusting the AFC tuning signal. In one non-limiting embodiment, the AFC tuning signal may be chosen based on a provided indication of the frequency of the oscillator or mechanical resonator, and no frequency steering signal may be applied. According to one embodiment, a frequency synthesizer receiving the oscillator output may be of such high resolution that no AFC signal is needed. Thus, information about the frequency of the oscillator output may be used to adjust other features of the system generating or receiving the output of the oscillator. Other scenarios are also possible.

Memory 313 storing the value 320 may be any suitable type of memory. According to one embodiment, the value 320 may be provided once upon connection of the system 306 to the oscillator 302. According to an alternative embodiment, the value 320 may be provided periodically to the system 306, for example whenever a device of which apparatus forms a part changes an operating frequency (e.g., when a cellular telephone changes frequency channels). According to a further embodiment, the value 320 may be provided upon powering on of the apparatus 300. Thus, it should be appreciated that the various aspects described herein relating to an oscillator including memory providing a value indicative of a frequency of the oscillator and/or mechanical resonator of the oscillator are not limited to the time or manner in which the value is provided.

The system 306 may utilize the value 320 in any suitable manner for determining suitable values of tuning signals 308 and/or 314. According to one embodiment, system 306 includes a reference table, such as a lookup table, storing values for tuning signal 308 based on the arbitrary frequency of the oscillator 302, an offset of the arbitrary frequency from a standard oscillator frequency, or any other value which may be represented by value 320, and the desired target frequency of the oscillating output signal 304 (e.g., a desired standard oscillator frequency). Thus, according to one embodiment, the system 306 receives the value 320 and refers to the reference table/lookup table stored therein to determine an appropriate value for tuning signal 308 to ensure the oscillating output signal 304 has the desired target frequency. According to one embodiment, the reference table/lookup table may provide values for both tuning signal 308 and tuning signal 314, although not all embodiments are limited in this respect. The reference table/lookup table within system 306 may be stored within memory of system 306, or in any other suitable manner. Furthermore, the reference table/lookup table may be populated or uploaded to the system 306 at any suitable time. For example, the table may be provided to the system 306 upon initial manufacturing of the system 306. Alternatively, the table may be updated or uploaded to the system 306 periodically.

While FIG. 3 illustrates a non-limiting embodiment in which a value 320 is provided from memory 313 to the system 306, it should be appreciated that alternative manners for providing the system 306 with such information are possible. For example, according to one alternative embodiment, the value 320 may be programmed into system 306 upon manufacture of the system 306, rather than being provided by the oscillator 302. For example, a manufacturer of system 306 may know the value 320 prior to oscillator 302 being connected to system 306, and therefore may provide the value 320 by programming it into memory of system 306, or by providing a lookup table as previously described based on the known value. According to one embodiment, the value 320 may be printed on a package of the oscillator 302, and the manufacturer or user of system 306 may read the value from the package and provide it to system 306 in any suitable manner. Other alternatives are also possible.

Figure 1B:
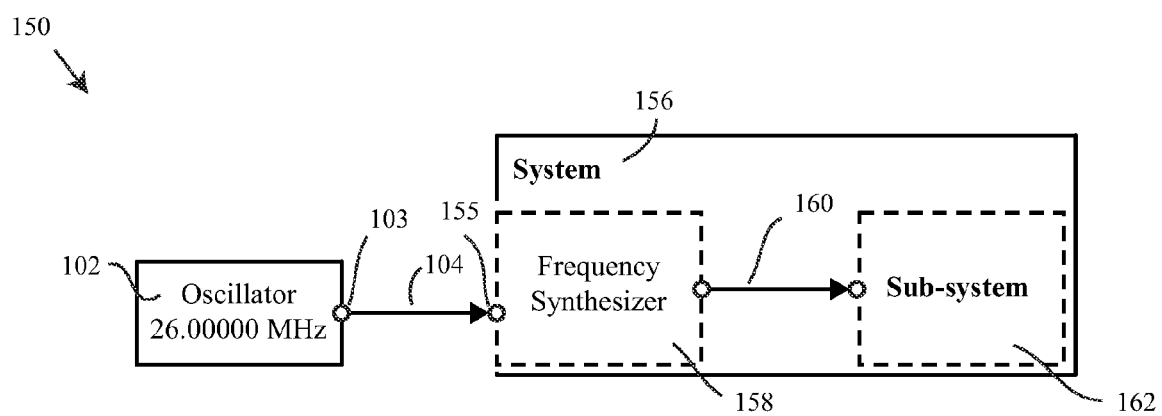
FIG. 1B illustrates a detailed view of a conventional system for generating an internal signal from an oscillating signal of standard frequency received from an oscillator.
Figure 2A:
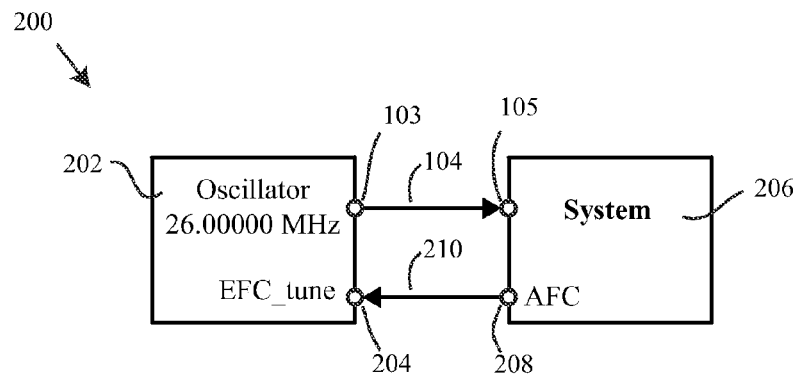
FIG. 2A illustrates a conventional configuration of an oscillator providing an oscillating signal to a system and the system applying an automatic frequency control (AFC) signal to the oscillator.
Figure 2B:
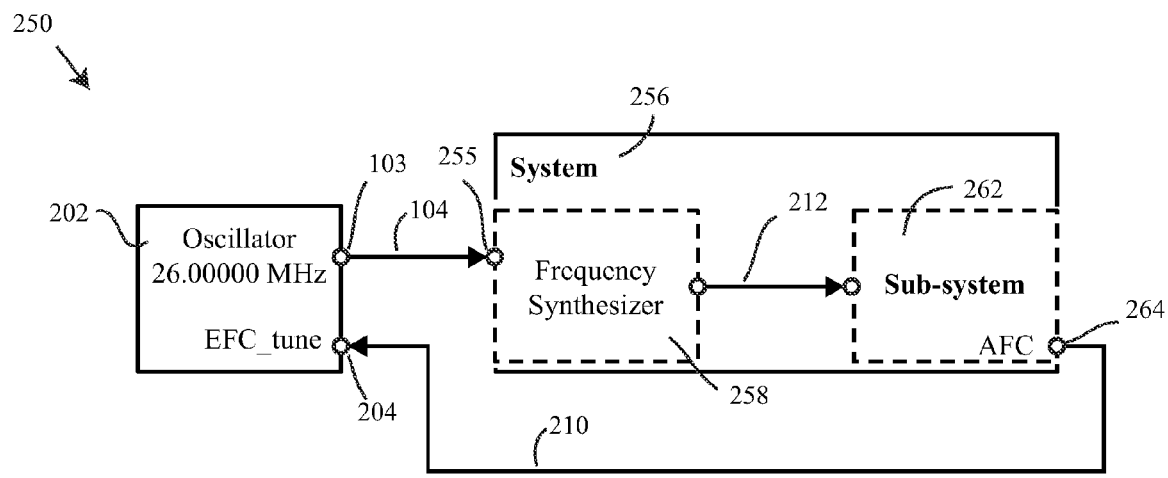
FIG. 2B illustrates a conventional configuration of an oscillator providing an oscillating signal to a system which generates an internal signal, and in which the system applies an AFC signal to the oscillator.
Figure 4:
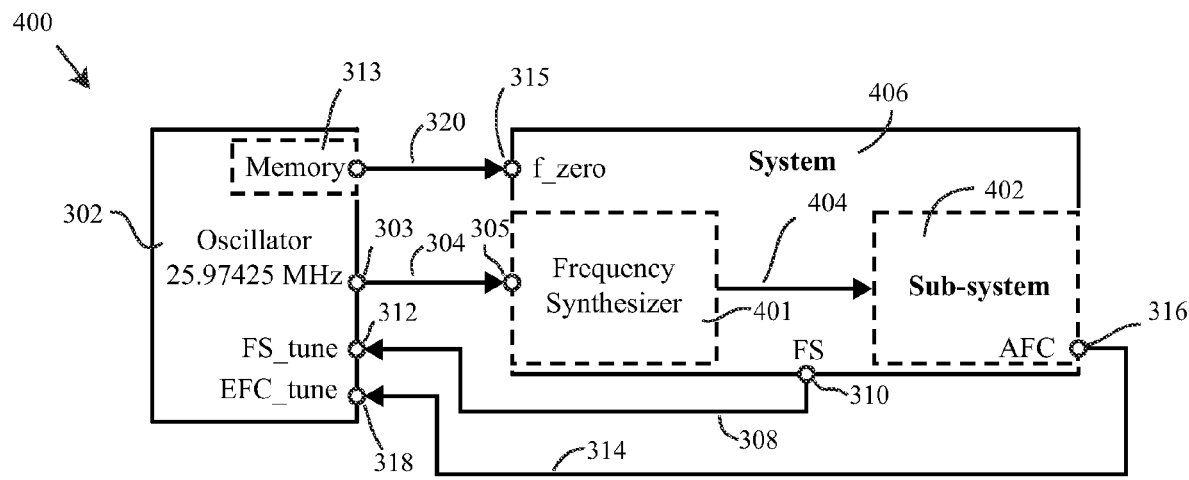
FIG. 4 illustrates in block diagram form an apparatus comprising a system coupled to an oscillator configured to generate an oscillating signal having an arbitrary frequency and in which the system generates an internal signal from the oscillating signal, according to an alternative embodiment of the present invention.

As described above in connection with FIGS. 1B and 2B, some systems receive a signal from an oscillator and synthesize an internal signal having a different desired frequency. The concepts described with respect to FIG. 3 may also apply to such a system. An example is illustrated in FIG. 4.

As shown, the apparatus 400 includes the oscillator 302 coupled to a system 406, which in one embodiment may represent a non-limiting detailed version of system 306 of FIG. 3. According to one embodiment, the oscillator 302 and system 406 may be formed on separate semiconductor dies (which may facilitate separate manufacture of the two), although not all embodiments are limited in this respect. The system 406 includes a frequency synthesizer 401 having an input coupled to the input port 305 of system 406. Furthermore, the system 406 includes a subsystem 402 which receives an output of the frequency synthesizer 401. In the non-limiting example of FIG. 4, the frequency synthesizer receives the oscillating output signal 304 of oscillator 302 and synthesizes a synthesized (internal) signal 404 which it provides to the subsystem 402. In some non-limiting embodiments, the frequency synthesizer may be an integer phase locked loop (PLL) and may be preset to a fixed divider ratio N/R, where N and R are integer numbers, so that the resulting frequency output by the frequency synthesizer is related to the received frequency (e.g., the frequency of oscillating output signal 304) by the ratio N/R. In such a scenario, because the oscillator output signal 304 may have an arbitrary frequency, at least initially, the synthesized signal 404 may also differ from a desired target frequency for the internal signal being provided to subsystem 402. It should be understood that using an integer phase locked loop is only one possible embodiment for the frequency synthesizer, and any other frequency synthesizer can be used, including fractional N PLL, direct digital synthesizer (DDS), and any other method.

In those scenarios in which the frequency synthesizer is unable to generate an internal signal having a desired target frequency, for example because the frequency synthesizer is an integer PLL and the oscillating output signal 304 has an arbitrary frequency, tuning signals 308 and 314 may be applied by system 406 to the oscillator 302 to shift the frequency of oscillating output signal 304 to a value such that frequency synthesizer 401 may then synthesize a synthesized signal 404 having a desired target frequency for subsystem 402. Thus, it should be appreciated that tuning signals 308 and 314 in this non-limiting embodiment may not be used to shift the frequency of oscillating output signal 304 itself to a standard oscillator frequency (although they may in some embodiments), but rather to a frequency from which the frequency synthesizer may generate an internal oscillating signal having the desired target frequency for sub-system 402.

A non-limiting example is now given. According to one embodiment, the frequency synthesizer 401 is a PLL having discrete frequency steps of 100 ppm. The oscillator 302 may initially output an oscillating output signal 304 having the indicated arbitrary frequency of 25.97425 MHz. Due to the step sizes of the frequency synthesizer 401, the synthesized signal 404 may have a frequency that is at best within ±50 ppm of a desired target frequency for the sub-system 402. The tuning signal 308 may, in this non-limiting example, have a value that may be selected in increments of ±10 ppm, and therefore may be selected to have a suitable value for adjusting the frequency of oscillating output signal 304 such that the synthesized signal 404 has a frequency within ±10 ppm of a desired target frequency for sub-system 402. The AFC tuning signal 314 may then assume a value suitable for shifting the frequency of the oscillating output signal 304 by a suitable amount such that frequency synthesizer 401 may synthesize a synthesized signal 404 having the target frequency. It should be appreciated that this is merely one non-limiting example, and that other manners of operation of the apparatus 400 are also possible. The values of tuning signals 308 and 314 in system 406 may be determined in any of the manners described above with respect to FIG. 3, or in any other suitable manner.

The techniques described above in connection with FIGS. 3 and 4 may be applied to various applications and contexts utilizing reference oscillators to generate an oscillating reference signal. One non-limiting example of a system in which a reference oscillator is used, and in which the concepts of FIGS. 3 and 4 may be used, is a radio frequency (RF) device, such as a cellular telephone. A non-limiting example is described with respect to FIG. 5, although it should be appreciated that other devices may also utilize the techniques described herein.

Figure 5:
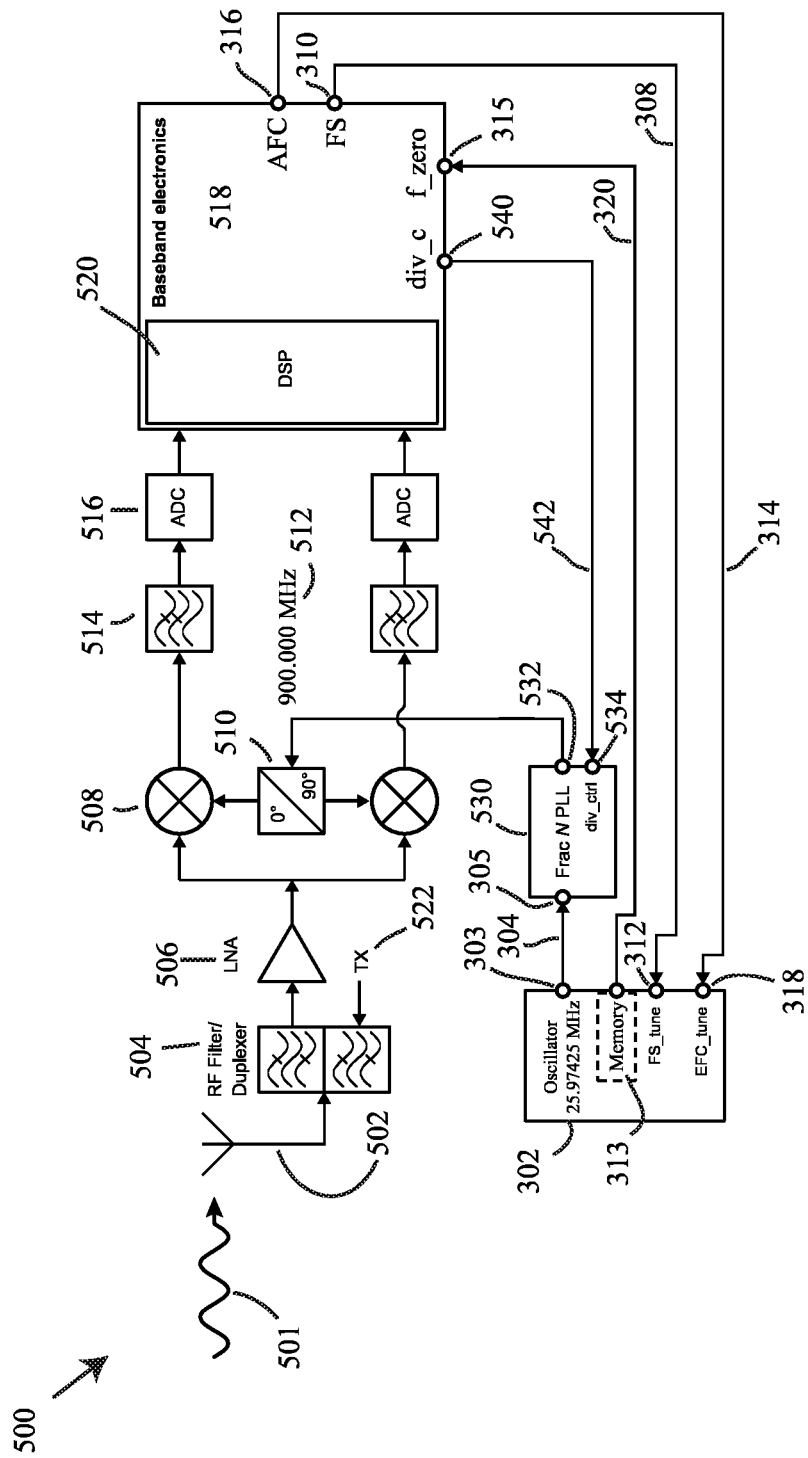
FIG. 5 illustrates a radio frequency (RF) front-end employing an oscillator configured to generate an oscillating signal having an arbitrary frequency, according to one embodiment of the present invention.

FIG. 5 illustrates an RF front-end 500, as might be used in a cellular telephone, illustrating in detail the receive path and excluding the details of the transmit path 522 for simplicity of the figure. It should be appreciated, however, that the principles of operation described with respect to the receive path may be analogously applied to the transmit path, and thus that the various aspects described herein relating to RF front-ends are not limited to receive paths only.

The RF front-end 500 has a direct-conversion receiver (DCR) architecture, also referred to as a Homodyne, Synchrodyne or zero-IF receiver. However, it should be appreciated that the aspects described herein relating to RF front-ends are not limited to the exact configuration of components illustrated in FIG. 5 or to any particular type of RF front-end unless otherwise stated. For example, the aspects described herein may also apply to heterodyne receivers or other receiver architectures.

The RF front-end 500 is configured to receive an incoming radio signal 501. According to one embodiment, the radio signal 501 is a cellular telephone signal, although other types of radio signals may be used in various embodiments, as the aspects described herein relating to RF front-ends are not limited to operation with cellular telephone signals. The radio signal 501 may include a carrier signal modulated with data (e.g., cellular telephone data) or may take any other suitable form.

The incoming radio signal 501 is received by the antenna 502 and passes through a band pass filter 504, which may be a duplexer. The resulting signal is then amplified by a low noise amplifier (LNA) 506 and down-converted by mixing the incoming radio signal with a reference signal 512 using mixer 508. The reference signal 512 is illustrated in this non-limiting example as having a frequency of 900 MHz for purposes of illustration, but may have any suitable frequency. It may be generated by a frequency synthesizer 530 (illustrated as a fractional PLL in this non-limiting example) which receives the previously described oscillating output signal 304. As previously mentioned, the oscillating output signal 304 may, in some embodiments, have an arbitrary frequency, at least before any tuning signals are applied to the oscillator 302 generating the oscillating output signal. After mixing the incoming radio signal 501 and the reference signal 512 using mixer 508 the resulting down-converted signal may be low pass-filtered in filter 514 and then converted from an analog signal to a digital signal using ADC 516. The resulting digital signal may contain the data or information of the radio signal 501 (e.g., cellular telephone data). The digitized signal produced by ADC 516 may then be input to the baseband electronics 518 for further processing. The baseband electronics 518 may comprise a digital signal processor (DSP) 520, which may filter and condition the received data, e.g., the cellular telephone data in those embodiments in which the RF front-end 500 is part of a cellular telephone.

The accuracy with which the data of radio signal 501 is recovered may depend, at least in part, on whether reference signal 512 has the desired reference frequency (e.g., 900 MHz in this non-limiting example). If the reference signal 512 does not have the desired reference frequency, the data of radio signal 501 may not be accurately recovered. According to some embodiments, it may be desirable for the reference signal 512 to have a frequency substantially matching the carrier frequency of radio signal 501 plus some offset, e.g., 900 MHz may correspond to the carrier frequency of the radio signal 501 plus some offset.

In the non-limiting example of FIG. 5, the reference signal 512 is synthesized by the frequency synthesizer 530, which again is a fractional N PLL in this non-limiting example, although it should be appreciated that other types of frequency synthesizers may alternatively be employed. The baseband electronics may adjust the frequency synthesizer by applying a control signal 542 from output port 540 (labeled "div_c") to an input port 534 (labeled as "div_ctrl"), which may adjust a setting of the fractional N PLL. This may be done to adjust the frequency of the reference signal 512 to match the carrier frequency of the radio signal 501 when the frequency channel of the apparatus 500 is changed, for example as occurs in cellular telephones when changing frequency channels. The baseband electronics may therefore store information indicating what setting of the N PLL corresponds to what frequency channel, so that the correct setting may be applied via control signal 542.

To accurately recover the data of radio signal 501, the frequency synthesizer 530 may be set to generate the reference signal 512 such that its frequency is as close to the carrier frequency of radio signal 501 as possible. However, due to the finite step size of the fractional N PLL and the fact that, in this non-limiting example, the frequency provided by oscillator 302 may be arbitrary, an offset $\Delta f$ between the carrier frequency of radio signal 501 and the frequency of reference signal 512 may result. The baseband electronics may apply previously described tuning signals 308 and 314 to tune the oscillator 302 so that the frequency of oscillating output signal 304 facilitates generation by frequency synthesizer 530 of a reference signal 512 having the desired carrier frequency. The values of tuning signals 308 and 314 may be determined by the baseband electronics in any of the manners previously described with respect to FIGS. 3 and 4, or in any other suitable manner. The offset $\Delta f$ may, in some embodiments, be in the range of ±50 ppm to ±100 ppm, and therefore the desired carrier frequency may not be achievable with conventional RF front-ends. However, use of the frequency steering tuning signal 308 in combination with the AFC tuning signal 314 may allow the RF front-end to achieve accurate operation by enabling the reference signal 512 to have the desired target frequency.

It should be appreciated that the tuning functionality described with respect to FIG. 5 may reduce or eliminate the occurrence of electrical interference found in conventional RF front-ends, thus beneficially improving the operation of the RF front-end. Conventional RF front-ends may experience interference when the oscillator output signal or frequency synthesizer signal, or some higher harmonics of those signals, undesirably mix with the received radio signal or higher harmonics of the received radio signal. According to the techniques described herein, for example in the non-limiting context of FIG. 5, the tuning range of the oscillator 302 may exceed the frequency step size of the frequency synthesizer by a factor of two, such that there are two or more possible settings of the frequency synthesizer for any desired target frequency of reference signal 512 based on an output signal of the oscillator having a given frequency. Accordingly, there may be two or more suitable values for the frequency steering tuning signal which may be applied to the oscillator 302 for any given desired target frequency of reference signal 512, one corresponding to each of the two or more possible frequency synthesizer settings. Thus, if a particular frequency steering value would result in undesirable electrical interference, one of the other possible frequency steering values for achieving the desired reference signal 512 may be used to reduce or eliminate the interference.

It should be appreciated from the foregoing that various aspects of the present invention are directed to systems and methods for generating a reference signal having a target frequency upon receipt of an oscillating output signal having an arbitrary frequency. As previously mentioned, various aspects of the present invention are alternatively directed to systems and methods which operate upon an oscillating signal having an arbitrary frequency, and need not necessarily generate from the arbitrary frequency an oscillating signal having a desired target frequency (e.g., a standard oscillator frequency). For example, the configuration and/or operation of one or more components of a system receiving an oscillating signal having an arbitrary frequency may be adapted to permit operation of the system with the arbitrary frequency. Accordingly, the types of adaptations which may be implemented may depend upon the components and configuration of the system receiving the oscillating signal from the oscillator. Various non-limiting examples are now described, although it should be appreciated that other implementations are possible depending on the configuration and components of the system.

According to one aspect of the present invention, a system receiving an oscillating signal having an arbitrary frequency includes an ADC configured to digitize a signal resulting from mixing a first signal with the oscillating signal of arbitrary frequency, and the sampling rate of the ADC may be selected to account for such mixing. An example is given with respect to FIG. 6, which illustrates an RF front-end 600 that is similar in many respects to previously described RF front-end 500 of FIG. 5, and which uses identical reference numbers for those components that are the same as in FIG. 5.

As shown and previously described, an incoming radio signal 501 received on antenna 502 is down-converted in mixer 508 using a reference signal. The resulting down-converted signal is supplied to a filter and is then digitized using an ADC. In the context of FIG. 5, the oscillator 302 and frequency synthesizer 530 may be controlled by signals 542, 308, and 304 to produce a reference signal 512 having a desired target frequency (illustrated as 900 MHz in the non-limiting example of FIG. 5), despite the oscillator 302 initially being configured to produce an oscillating signal of arbitrary frequency (illustrated as 25.97425 MHz in FIG. 5). The desired target frequency for reference signal 512 may match the frequency of the carrier signal of radio signal 501 including an offset corresponding to the intermediate frequency. In those instances, the data of the down-converted signal output by mixer 508 may typically appear in the frequency domain at either the baseband frequency or an intermediate frequency. In such instances, the sampling rate of the ADC 516 may be selected to suitably sample the down-converted signal such that the data on the down-converted signal is accurately captured by the digitizing process implemented by ADC 516 without inducing a frequency shift of the data during the digitizing process.

Figure 6:
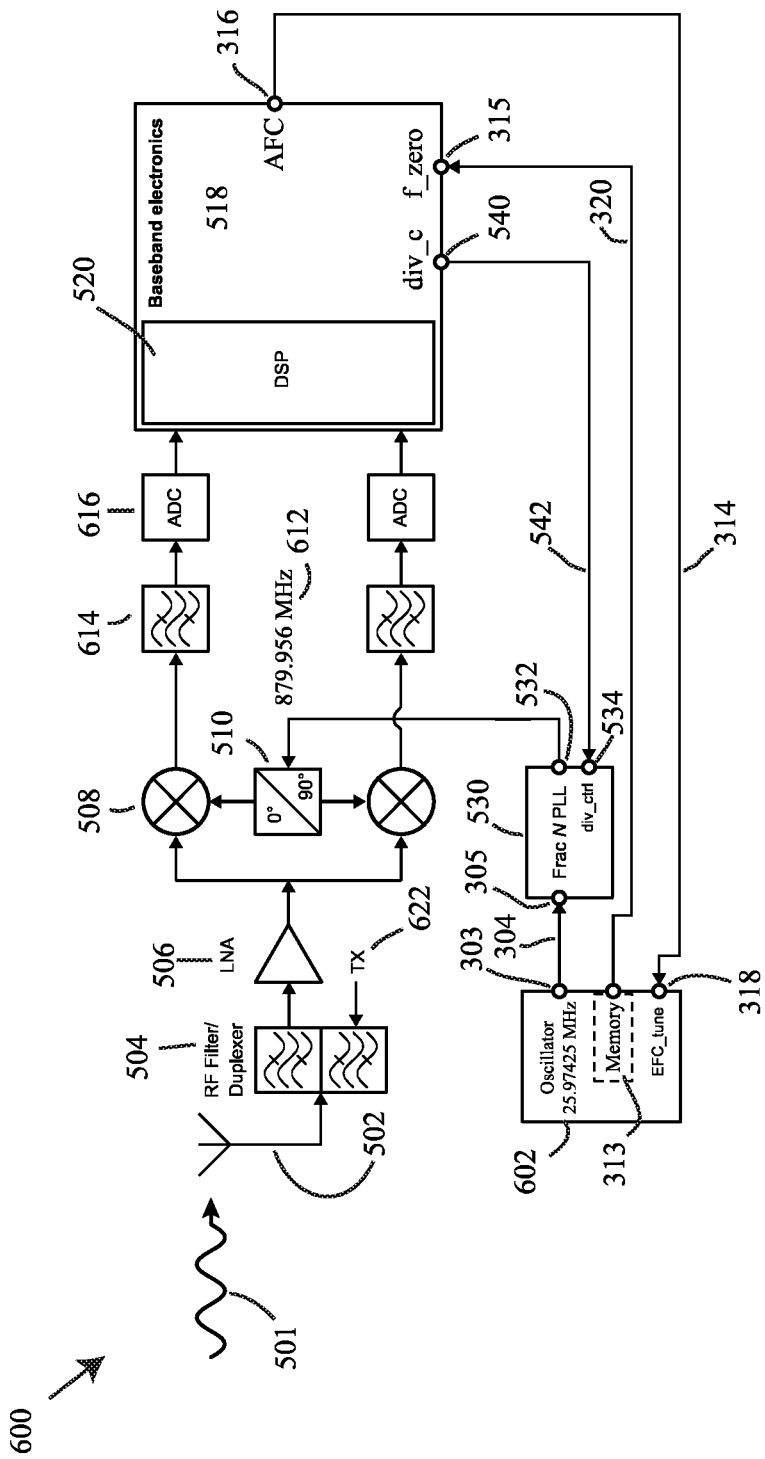
FIG. 6 illustrates an alternative RF front-end employing an oscillator configured to generate an oscillating signal having an arbitrary frequency, and in which an analog-to-digital converter is configured to operate as a mixer, according to another embodiment of the present invention.

However, while it was previously described that apparatus 500 may operate by generating a reference signal 512 having a desired target frequency, such is not the case according to the present aspect described with respect to RF front-end 600 of FIG. 6. According to the present aspect, oscillator 602 may be configured to generate an oscillating output signal 304 having an arbitrary frequency (e.g., 25.97425 MHz) which is not compensated by a frequency steering signal, such that the reference signal 612 does not have the desired target frequency (e.g., a frequency corresponding substantially to the carrier frequency of radio signal 501 including an offset, corresponding to the intermediate frequency). For example, the tuning signal 308 may not be applied according to this aspect, such that the arbitrary frequency of oscillating output signal 304 results in reference signal 612 having a frequency differing from the desired target frequency. In the non-limiting example of FIG. 6, the reference signal may have a frequency of, for example, 879.956 MHz, differing from a target frequency value of 880 MHz. As a result, the data of the down-converted signal output by mixer 508 is shifted in the frequency domain relative to the intermediate frequency of the down-converted signal. The down-converted signal may then be filtered in a band-pass filter 614. Due to the frequency shift of the data of the down-converted signal relative to the intermediate frequency, operating the ADC 616 at a sampling rate as though the reference signal 612 had the desired target frequency (e.g., 880 MHz) results in the data of the digitized signal being frequency shifted relative to the intermediate frequency.

Thus, according to one aspect of the present invention, the sampling rate of the ADC 616 may be selected to compensate for the shift in the frequency domain of the data of the down-converted signal relative to the intermediate frequency. The sampling rate may be selected based on a known or detected offset of the frequency of the reference signal 612 from the carrier signal of radio signal 501 including the offset related to the intermediate frequency. For example, the frequency offset may be known by receiving a value from memory 313, and the baseband electronics may then set a suitable sampling rate of the ADC 616, as a non-limiting example. Other methods of determining a suitable sampling rate of the ADC are also possible. In this manner, the RF front-end 600 may suitably operate to accurately recover the data of radio signal 501 despite the oscillator 602 providing an oscillating signal 304 having an arbitrary frequency, and despite the frequency synthesizer 530 generating a synthesized signal having a frequency differing from the carrier frequency of radio signal 501 including an offset corresponding to the intermediate frequency. Thus, the need for an oscillator providing a precise frequency matching a standard oscillator frequency may be minimized or eliminated, which may simplify design of the system and allow for use of oscillators having various beneficial characteristics, such as ease of manufacture, low cost, or other beneficial characteristics.

According to one embodiment of the present aspect, the sampling rate of the ADC may be selected to match the resulting intermediate frequency generated by mixing of the radio signal 501 with the reference signal 612 of arbitrary frequency. A non-limiting example is now given. For purposes of this non-limiting example, the intermediate frequency which would be generated by mixing the radio signal 501 with a reference signal of 880 MHz may be 20 MHz. However, if the reference signal (e.g., reference signal 612) instead is offset from 880 MHz by 50 ppm, the resulting intermediate frequency output by mixer 508 may be 20.044 MHz, rather than 20 MHz, in those embodiments in which the reference signal is 50 ppm lower than 880 MHz. Accordingly, the sampling rate of ADC 616 may be selected to be approximately equal to the intermediate frequency, i.e., 20.044 MHz in this non-limiting example. It should be appreciated that operating the ADC 616 at such a frequency in this context is below the Nyquist criterion, such that the ADC 616 may effectively operate as a mixer, compensating for the offset from 880 MHz of the reference signal 612. Again, it should be appreciated that this is merely one non-limiting example. It should also be appreciated from the foregoing example that the amount by which the sampling rate of ADC 616 may be frequency shifted compared to what would be appropriate if the reference signal 612 had the desired target frequency may equal the absolute offset of the reference signal from the desired target frequency. It should also be appreciated that if the reference oscillator is lower than a desired target frequency, the sampling rate of the ADC 616 may be selected to be higher than if the reference oscillator had the desired target frequency, and vice versa.

While the present aspect has been described with respect to the receive path of the RF front-end 600, it should be appreciated that the same concept may apply equally well to the transmit path 622, although that path is not illustrated in detail in FIG. 6. For example, the transmit path may include a digital-to-analog converter (DAC) configured to receive a digital signal from DSP 520 including digital data to be transmitted. The DAC may convert the digital signal to an analog signal, which may then be up-converted by mixing with a suitable oscillating reference signal (e.g., similar to reference signal 612). If the oscillating reference signal used for the up-conversion differs from a standard oscillator frequency, the data of the resulting up-converted signal may be shifted in the frequency domain relative to the intermediate frequency. Such a shift may be undesirable, and may be accounted for in some embodiments by sampling the digital data signal from the DSP using a suitable sampling rate of the DAC to account for the frequency shift which is induced during the up-conversion process using the arbitrary frequency reference signal. According to one embodiment, the sampling rate of the DAC may be selected to approximately match the frequency shift of the intermediate frequency introduced during up-conversion, in a manner analogous to that just described for the receive path. However, it should be appreciated that according to one embodiment if the arbitrary frequency of the oscillating reference signal used in the up-conversion process is greater than the expected standard oscillator frequency, then the sampling rate of the DAC may be lowered compared to what would be appropriate if the oscillating reference signal had the standard oscillator frequency, and vice versa.

According to another aspect of the present invention, a system receiving an oscillating signal from an oscillator having an arbitrary frequency includes a digital signal processor (DSP) which may be used to digitally shift data of a signal resulting from mixing a first signal (e.g., a cellular telephone signal) with the oscillating signal of arbitrary frequency. An example is now given with reference to FIG. 7, although it should be appreciated that other systems may similarly implement the described system and techniques. The RF front-end 700 of FIG. 7 is similar in many respects to RF front-end 500, and the same reference numbers are used to illustrate identical components.

As described, the RF front-end 700 may produce a down-converted signal from mixer 508, which may be low-pass filtered by filter 514 and then digitized by ADC 516. The reference signal 712 used for the mixing process may not have a frequency substantially matching the frequency of the carrier signal of radio signal 501, such that the data of the down-converted signal provided by mixer 508 may be shifted in the frequency domain relative to the intermediate frequency, as previously described. For example, the reference signal 712 may have a frequency of 900.045 MHz according to one embodiment, being offset from a target value of 900 MHz due to oscillator 602 producing an oscillating output signal of arbitrary frequency. According to the previous aspect, the sampling rate of the ADC (e.g., ADC 616 in FIG. 6) may be shifted to account for the shift in the frequency domain of the data of the down-converted signal. However, in the present aspect illustrated by FIG. 7, the sampling rate of the ADC 516 may be selected as if the reference signal 712 had a frequency matching that of the carrier signal of radio signal 501 (e.g., a target value of 900 MHz). As a result, the digital signal provided by ADC 516 may include digital data shifted in the frequency domain relative to the intermediate frequency. According to the present aspect, the DSP 720 may receive the digital signal from ADC 516 and may re-sample the digital signal at a sampling rate suitable to effectively shift the digital data of the digital signal such that it accurately represents the data of radio signal 501. According to this aspect, the DSP may effectively operate as a frequency mixer.

Figure 7:
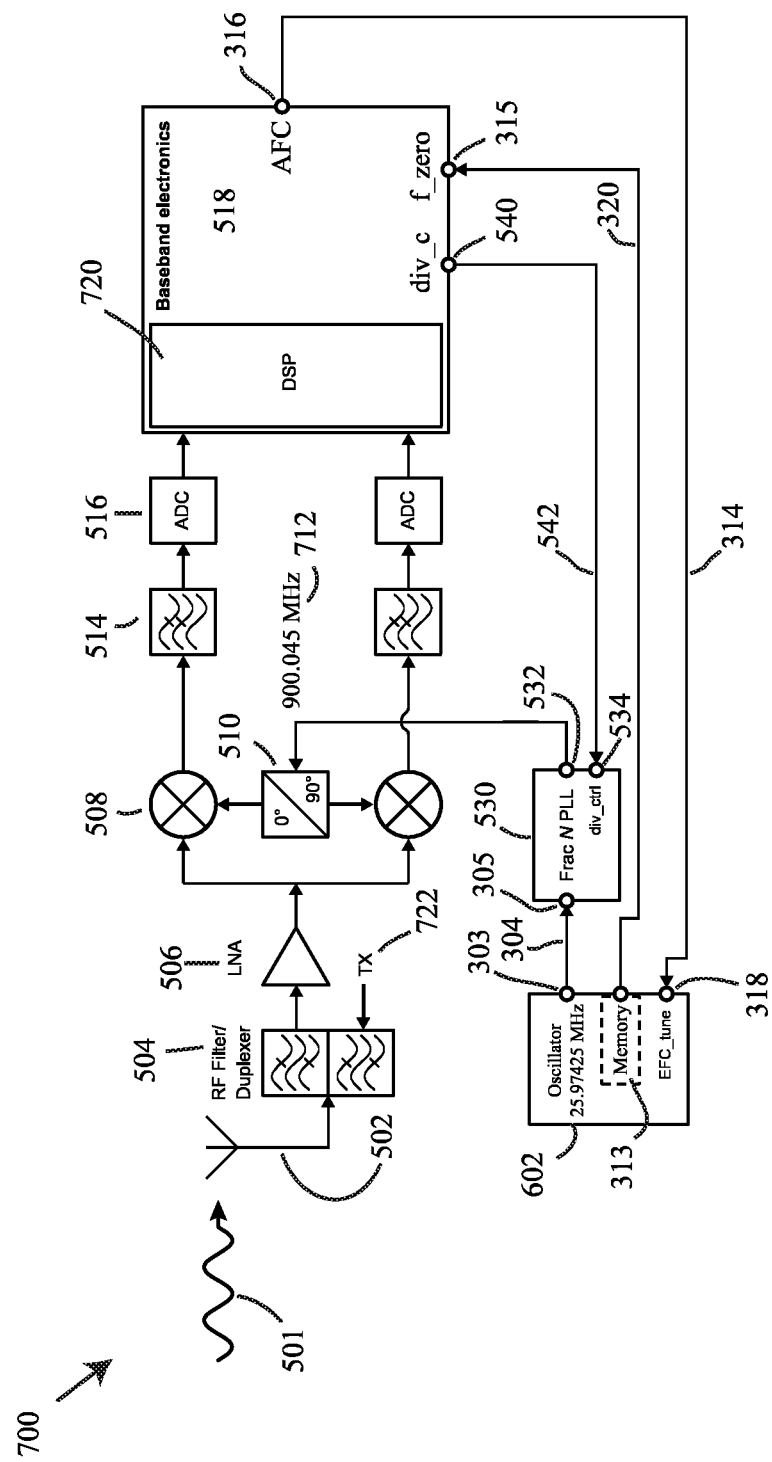
FIG. 7 illustrates an alternative RF front-end employing an oscillator configured to generate an oscillating signal having an arbitrary frequency, and in which a digital signal processor (DSP) is configured to induce a frequency shift of digital data, according to another embodiment of the present invention.

While the present aspect has been described with respect to the receive path of the RF front-end 700, it should be appreciated that the same concept may apply equally well to the transmit path 722, although that path is not illustrated in detail in FIG. 7. The transmit path 722 of RF front-end 700 may be similar to the illustrated receive path of FIG. 7, although the output of the DSP may be provided to a DAC, which may then be coupled to a mixer to perform up-conversion of the signal to be transmitted. As previously described with respect to the aspects relating to altering a sampling rate of a DAC to account for use of an oscillating reference signal of arbitrary frequency, the up-conversion process performed using the oscillating signal of arbitrary frequency may result in the data of the up-converted signal being shifted in the frequency domain relative to the baseband and intermediate frequencies. In some embodiments, such a frequency shift of the data may be undesirable, and may be accounted for by digitally shifting the digital data of the digital data signal output by the DSP. The frequency shift of the digital data may be induced by the DSP itself, according to one non-limiting embodiment. The amount of the frequency shift induced by the DSP may be selected to account for an expected frequency shift from the baseband and intermediate frequencies induced during up-conversion by the use of a reference signal of arbitrary frequency, and therefore in some embodiments may be selected based on a known value of the arbitrary frequency (e.g., provided from the oscillator as previously described). According to one embodiment, the DSP may shift the digital data to a lower frequency than would otherwise be used if the arbitrary frequency of the oscillating reference signal used for up-conversion is higher than the expected standard oscillator frequency. Similarly, the DSP may shift the digital data to a higher frequency than would otherwise be used if the arbitrary frequency of the oscillating reference signal used for up-conversion is lower than the expected standard oscillator frequency. By suitable selection of the amount of frequency shift to induce in the digital data signal, the subsequent DAC conversion and up-conversion using an oscillating reference signal of arbitrary frequency may result in the data of the up-converted signal appearing at a desired frequency or frequencies.

Figure 8:
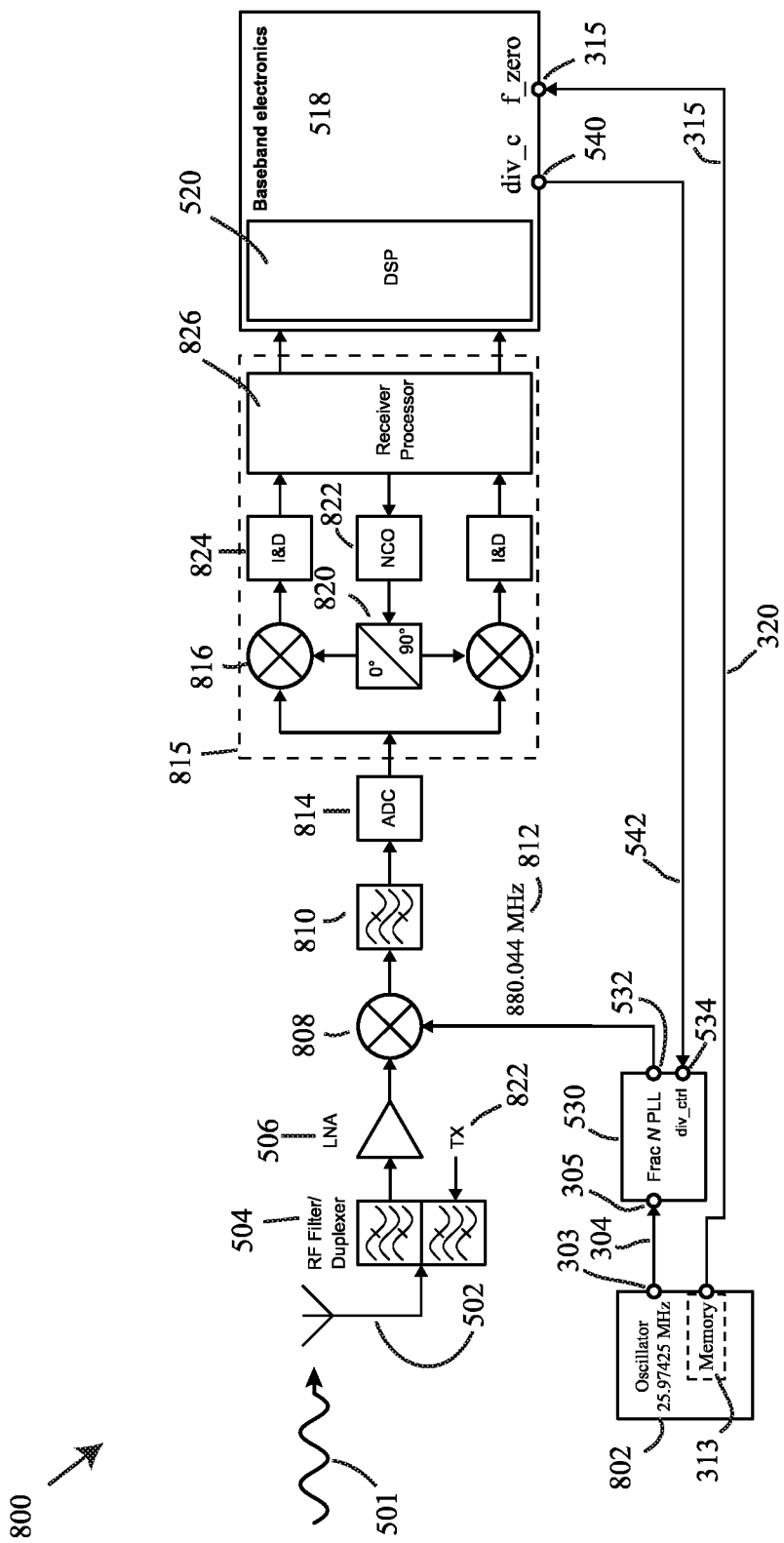
FIG. 8 illustrates an RF front-end including a carrier tracking loop and employing an oscillator configured to generate an oscillating signal having an arbitrary frequency, according to an embodiment of the present invention.

According to a further aspect of the present invention, a system receiving an oscillating signal having an arbitrary frequency may include a carrier tracking loop adapted to account for the arbitrary frequency of the oscillating signal. Reference is made to FIG. 8 for purposes of providing a non-limiting example. The reference signal 812 has a frequency that does not substantially match the frequency of the carrier signal of radio signal 501, and in this non-limiting example has a frequency of approximately 880.044 MHz, arising from the arbitrary frequency of the oscillating signal provided by oscillator 802 (which, it should be noted, is not configured to receive either a frequency steering signal or an AFC tuning signal). As a result, the down-converted signal provided by mixer 808 has data that is shifted in the frequency domain relative to the intermediate frequency. The resulting down-converted signal is filtered by band-pass filter 810. The sampling rate of the ADC 814 in this non-limiting aspect is selected as though the reference signal 812 has a frequency matching the frequency of the carrier signal of radio signal 501 including the offset equivalent to the intermediate frequency, such that the digital signal provided by ADC 814 includes digital data shifted in the frequency domain.

According to this aspect, a carrier tracking loop 815 is used at the intermediate frequency to lock to the carrier of the radio signal 501 at the intermediate frequency. For this purpose the digital intermediate frequency data is down-converted by a mixer 816 using a frequency from a numerically controlled oscillator (NCO) 822. The down-converted signal undergoes an integrate and dump 824 operation and is passed on to the receiver processor 826. The receiver processor includes a PLL discriminator and loop filter and controls the NCO 822. In this manner, the digital data of the signal output by ADC 814 is effectively down-converted to the baseband such that it accurately reflects the data of radio signal 501 independent of the frequency of the reference oscillator 802. As a result the reference oscillator 802 does not require a AFC to obtain lock to the carrier frequency of the received radio signal 501.

Some aspects of the present invention are directed to the design and operation of circuitry for generating a real time clock signal. Real time clocks provide an output indicative of current time (or "real time"), i.e., the passage of time according to standard timing units (e.g., year, month, date, day, hour, minute, and second). Conventional real time clocks utilize a standard frequency oscillator signal which has a frequency that is a power of 2 (typically 32 kHz, i.e., 32,768 Hz) and is divided down multiple times to generate a 1 Hz signal that is then used to track the passage of time. The accuracy of such conventional real time clocks therefore depends on the frequency accuracy of the oscillator, and uses division circuitry to generate the 1 Hz signal from the initial 32 kHz signal.

According to an aspect of the present invention, a real time clock utilizes a reference signal of arbitrary frequency generated by an arbitrary frequency reference oscillator, wherein the arbitrary frequency is not a power of 2. The reference signal of arbitrary frequency may be used to generate a reference clock signal having a one second time base (i.e., 1 Hz) or a time base of N or 1/N, where N is an integer. The reference clock signal may be generated by counting a number of oscillations of the reference signal of arbitrary frequency and initiating a clock pulse when the number of oscillations equals the arbitrary frequency of the reference oscillator. According to some such embodiments, the reference clock signal may therefore be generated without the need for or use of division circuitry. The reference clock signal may be provided as an input to a real time clock, which may track the passage of time. Non-limiting examples will be described further below.

According to one aspect of the present invention, a real time clock uses a tunable reference oscillator. The tunable reference oscillator may have an arbitrary frequency and may be frequency tunable. The output signal of the reference oscillator may be used to generate a reference clock signal having a desired time base, as described above. For example, a number of oscillations of the oscillating signal provided by the tunable reference oscillator may be counted and a clock pulse generated each time the counted number of oscillations equals the frequency of the oscillator, for example if a reference clock signal having a one second time base is to be generated. The reference clock signal may then be used by a real time clock to track current time.

According to one embodiment, the tunable reference oscillator may be frequency tuned to account for temperature induced variations in the frequency of the reference oscillator output signal. Non-limiting examples are described below.

According to another embodiment, the tunable reference oscillator may be frequency tuned to set the frequency of the reference oscillator to an integer fraction of the desired time base of the reference clock signal generated from the output of the tunable reference oscillator. Such tuning to an integer fraction may, in some embodiments, simplify operation of any counter used to count oscillations of the reference oscillator output, in that the counter may be an integer counter as opposed to a fractional counter. As a non-limiting example, an arbitrary frequency oscillator with an output frequency of 127,123.456 Hz, may be tuned to 127,123 Hz to reduce the complexity of the counter by allowing for use of an integer based counter.

Figure 9:
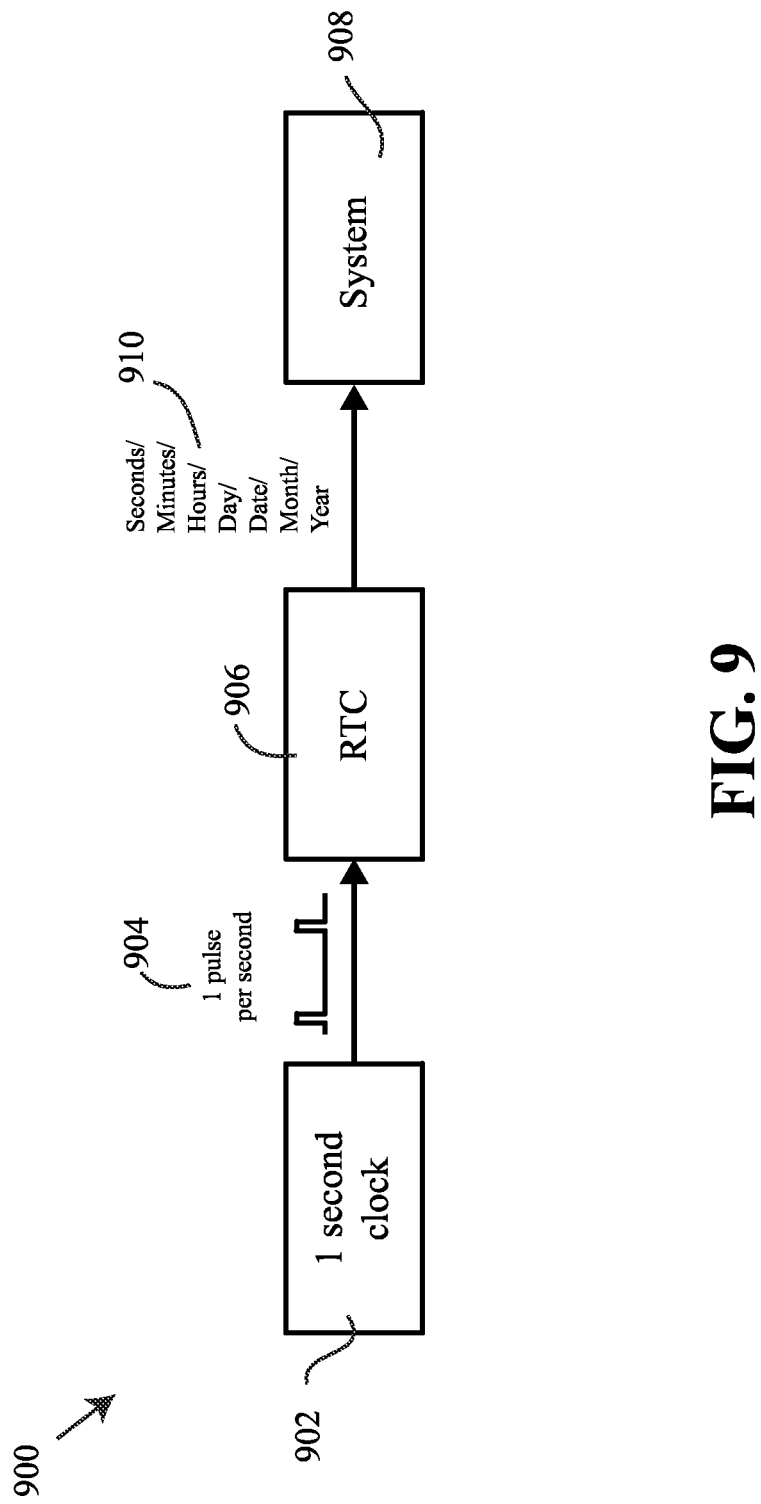
FIG. 9 illustrates a circuit using a clock with one second period pulses in combination with a real time clock (RTC).

FIG. 9 illustrates a non-limiting example of a circuit 900 for generating a real time clock signal using a reference clock providing a reference clock signal of approximately 1 Hz. The circuit 900 includes a reference clock 902 (shown as a 1 second clock in the non-limiting example illustrated), providing a reference clock signal 904 which in some embodiments may be a pulse train with one pulse per second. The reference clock signal 904 is provided to a real time clock 906, which may be simplified compared to conventional real time clocks in that it may not include division circuitry for dividing the reference clock signal. The real time clock 906 may use the reference clock signal 904 to produce an output 910 indicative of the current time in any of seconds, minutes, hours, day, date, month, year, any combination thereof, or in any other suitable units. The output 910 indicative of the current time may be provided to a system 908, which may be any of the types of systems described previously herein or any other type of system. For example, according to one non-limiting embodiment, the system 908 may be part of a global positioning system (GPS) receiver.

Figure 10:
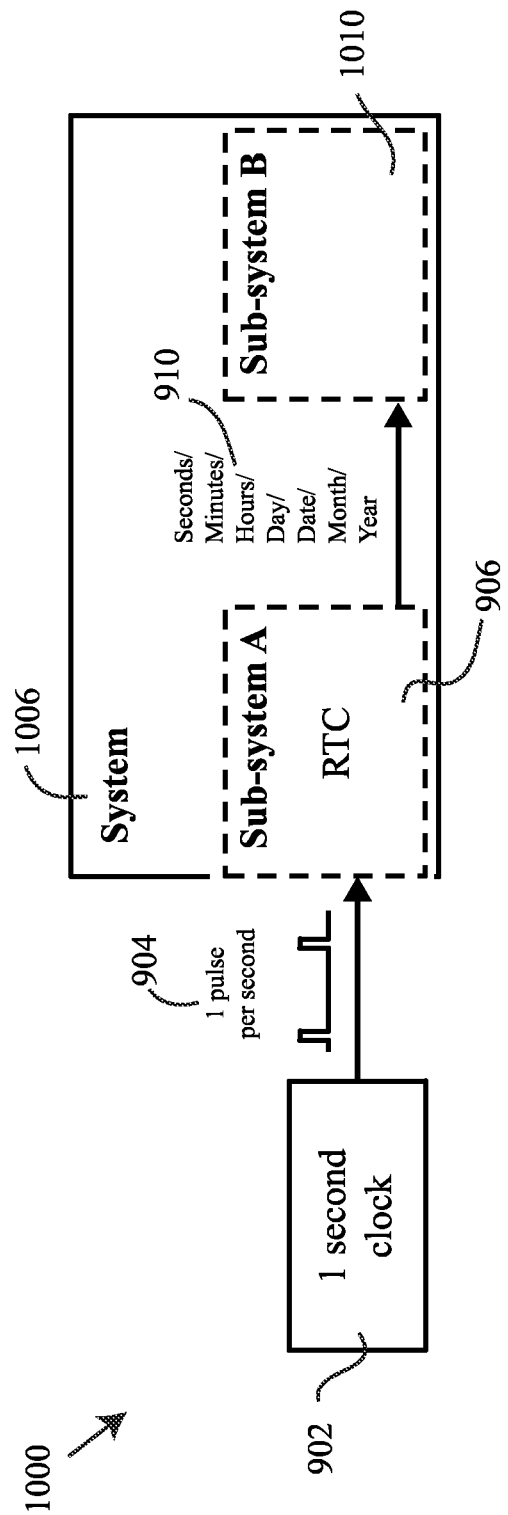
FIG. 10 illustrates a circuit using a clock with one second period pulses in combination with a system using a RTC as an internal sub-system.

FIG. 10 illustrates a variation on the circuit 900 of FIG. 9, in which the real time clock 906 may form a subsystem within a larger system 1006. The system 1006 of circuit 1000 may be any type of system, such as any of the types previously described herein, or any other type which may use a real time clock. The real time clock 906 may provide the output 910 to a subsystem 1010, which may be any suitable type of subsystem, including any of the types previously described herein.

While FIGS. 9 and 10 are illustrated as utilizing a reference clock signal with a time base of one second (i.e., a 1 Hz signal), it should be appreciated that the various aspects described herein relating to real time clocks, including those examples described above and those described below, are not limited in this respect. A reference clock signal of any suitable time base may be generated. For example, a reference clock signal with a frequency of N Hz or a time base of 1/N may be used, wherein N is an integer. Reference clock signals with a time base of one second are shown in FIGS. 9 and 10, as well as some of the following examples, for purposes of illustration only.

Figure 11:
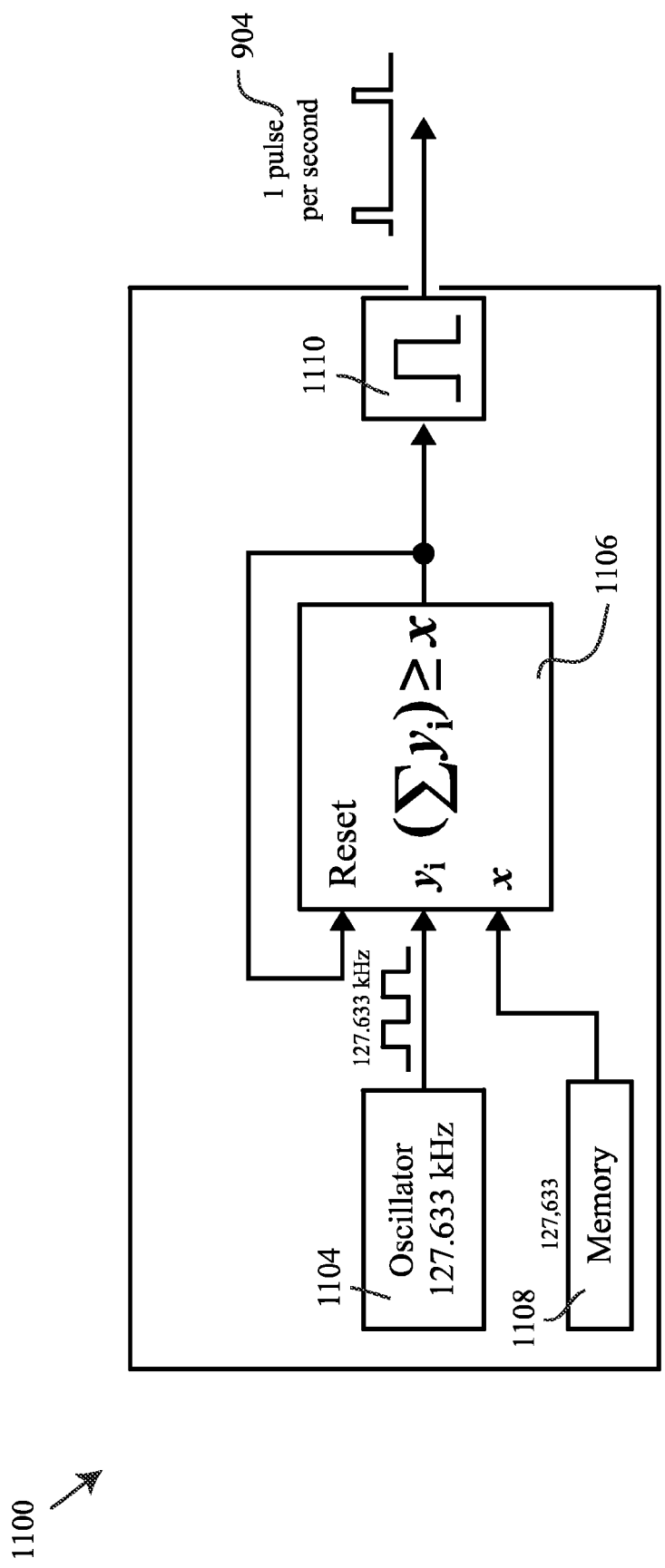
FIG. 11 illustrates a one second period clock using an internal oscillator with arbitrary frequency.

The reference clock 902 of FIGS. 9 and 10 may take any suitable form for generating a reference clock signal having a frequency of approximately 1 Hz (or any other suitable time base). According to one aspect of the present invention, a reference clock generator generating a reference clock signal having a frequency of approximately 1 Hz may comprise an arbitrary frequency oscillator providing an arbitrary frequency oscillating output signal to counter circuitry, which may count a number of oscillations of the oscillating output signal. A non-limiting example is shown in FIG. 11.

As shown, the reference clock generator 1100 includes an oscillator 1104, which may be an arbitrary frequency oscillator with a frequency that is not a power of 2, counter and comparator circuitry 1106, memory 1108, and a pulse generator 1110. As mentioned, the oscillator 1104 may be an arbitrary frequency oscillator with a frequency that is not a power of 2, although not all embodiments are limited in this respect. As shown, the oscillator 1104 may be coupled to the counter and comparator circuitry 1106, such that an oscillating output signal from oscillator 1104 is provided to an input of the counter and comparator circuitry 1106. The counter and comparator circuitry 1106 may count a number of oscillations of the oscillator output signal provided by oscillator 1104, and may compare the counted number of oscillations to a reference number. According to the non-limiting embodiment shown, the reference number may be provided by memory 1108 (which, in some embodiments, may be part of the oscillator 1104, but in other embodiments may be separate).

According to one embodiment, the reference number provided corresponds to the frequency of oscillator 1104. Thus, the counter and comparator circuitry 1106 may compare the number of oscillations of the oscillator output signal from oscillator 1104 to the frequency of oscillator 1104. According to one embodiment, the counter and comparator circuitry counts a number of rising edges of the oscillator output signal provided by the oscillator 1104. However, other manners of counting the number of oscillations of the oscillator output signal are also possible.

When the number of counted oscillations of the oscillator output signal equals the reference number, the counter and comparator circuitry 1106 may provide an indication of this event to pulse generation circuitry 1110, which may produce a pulse. According to one embodiment, the indication provided by counter and comparator circuitry 1106 may be a state change in the output signal provided to the pulse generator 1110, e.g., from a comparator circuit of the counter and comparator circuitry. Thus, in those embodiments in which the reference number utilized by the comparator corresponds to the frequency of the oscillator 1104, the resulting signal produced by the pulse generator 1110 may include one pulse (e.g., a clock pulse) every second, in the form of a pulse train or in any other suitable form.

As also shown in FIG. 11, a feedback path may be coupled between an output of the counter and comparator circuitry 1106 and a reset port of the counter and comparator circuitry. In this manner, the counter and comparator circuitry may be reset each time the number of oscillations of the oscillator output signal reaches the reference number.

While FIG. 11 illustrates the counter and comparator circuitry 1106 as being a single unit, it should be appreciated that various alternatives are possible and are contemplated within the present disclosure. For example, the counter and comparator circuitry 1106 may alternatively be implemented as distinct counter circuitry and comparator circuitry. The specific implementation of the circuitry is not limiting, and the form shown in FIG. 11 is provided for purposes of illustration.

A non-limiting specific example of frequencies and reference numbers is now given with respect FIG. 11. As shown in this non-limiting example, the oscillator 1104 may have a frequency of 127.633 KHz (which, it is noted, is not a power of 2), such that output signal of the oscillator has that same frequency. The memory 1108 has a reference number stored therein which may be provided to the counter and comparator circuitry 1106, and in this non-limiting example may be 127,633. The counter and comparator circuitry 1106 may count each oscillation of the oscillator output signal up to 127,633, at which point the counted number of oscillations equals the reference value stored in the memory 1108. At that time, a state of the output of counter and comparator circuitry 1106 may change (e.g., a low state may change to high state or vice versa), thus resetting the counter and comparator circuitry 1106 and also creating a clock pulse causing pulse generator 1110 to generate and output pulse 904.

In some embodiments, the reference value provided to the counter and comparator circuitry may differ from the exact number of oscillations of the reference oscillator which occur within one second. For example, the reference value may be based on a 127.633 KHz oscillator, but the actual frequency of the oscillator may be 127,632.5 Hz, such that pulses at the output of the counter and comparator circuitry are about 4 ppm (part per million) late. To reduce the timing error, a higher frequency oscillator may be used. For example, using a reference oscillator with ten times higher output frequency will reduce the timing error by a factor of ten. However, use of higher frequency oscillators also may involve higher power consumption, which may be viewed as undesirable and which therefore may be balanced against the desire for increased accuracy of the signal.

Figure 12:
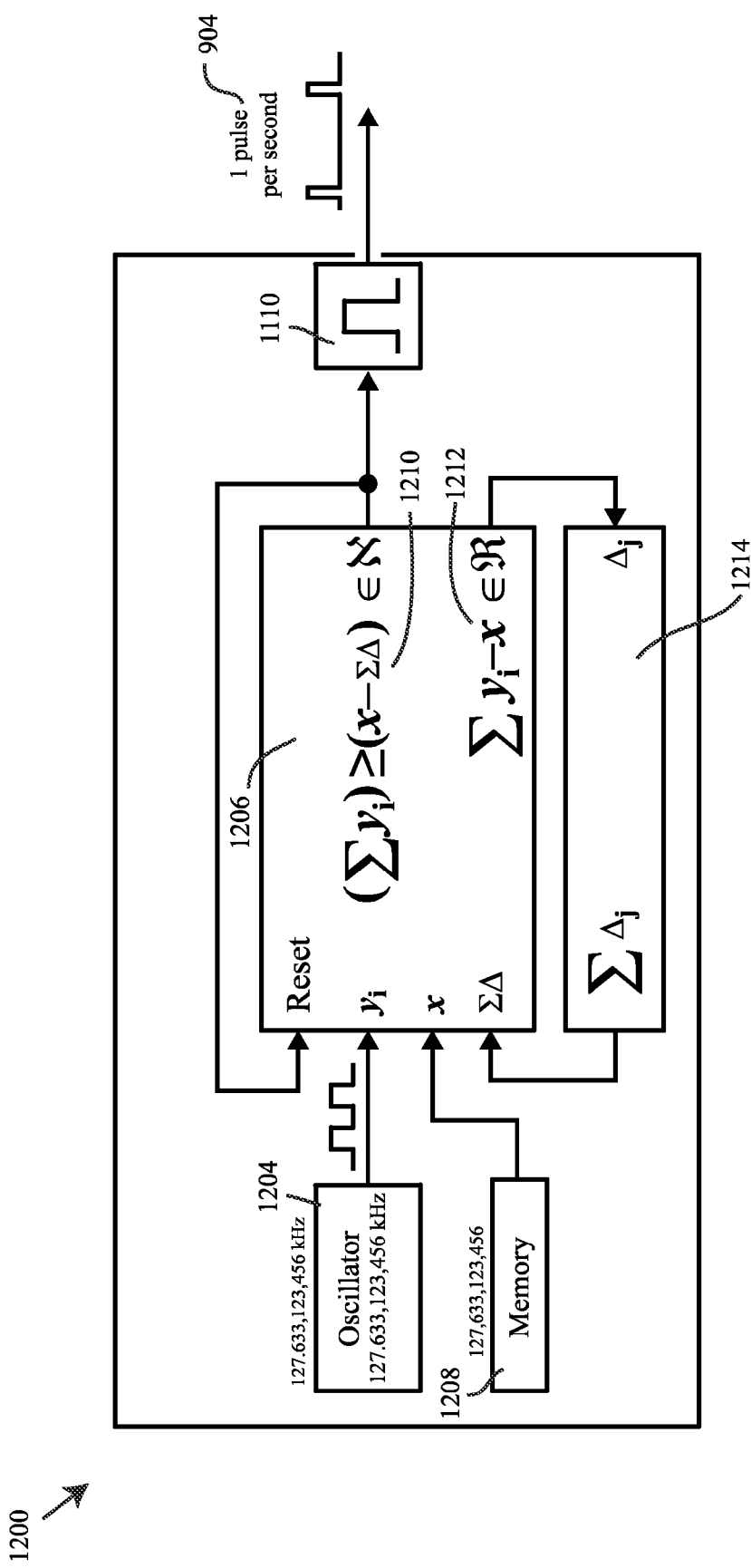
FIG. 12 illustrates a one second period clock using an internal oscillator with arbitrary frequency, according to another embodiment of the present invention.

According to one aspect of the present invention, a reference clock configured to generate a reference clock signal having a frequency of approximately 1 Hz (or any other suitable time base) may utilize a correction factor to improve accuracy of the output reference signal. A non-limiting example is shown with respect to FIG. 12. As shown, the reference clock 1200 includes an oscillator 1204, counter and comparator circuitry 1206, memory 1208, and the pulse generator 1110. In this non-limiting embodiment, the memory 1208 includes a value having more significant digits than that of the example of memory 1108 in FIG. 11. As with the previously described example, the counter and comparator circuitry counts the number of rising edges of the oscillator output signal of oscillator 1204 and compares that number to the reference value stored in memory 1208. This comparison includes a correction factor $\Sigma\Delta$. Once the reference value 1210 ($x-\Sigma\Delta$) is reached, the output level of the counter and comparator circuitry may change (e.g., from low to high) and a pulse may be generated by pulse generator 1110. At the same time, the residual of the counter and comparator circuitry and the reference value 1212 is integrated in an error accumulator 1214, which may be any suitable type of accumulator. This residual $\Delta_j$ is a real number within the bounds $0 \leq \Delta_j < 1$. When the value of $\Delta_j$ reaches 1, a value of 1 is added to the counted number of oscillations of the oscillator signal, and the accumulated error is reset to zero.

Thus, the accumulated timing error $\Sigma\Delta$ is taken into account in the counter and comparator circuitry 1206 to improve the accuracy of the reference clock generator. Accordingly, although one second pulses 904 may show some jitter in the range of parts per million, the accumulated error may be compensated for after the appropriate number of clock cycles (e.g., 127,633,123,456 clock cycles in this non-limiting example). Thus, the maximum error for the reference clock in this non-limiting embodiment is less than plus or minus one clock cycle, but the average timing error is zero. This method therefore enables the use of a low frequency reference oscillator while providing accurate generation of a 1 Hz output signal (or any other suitable time base) and at the same time minimizing power consumption. It should be understood, however, that this is one non-limiting example of a manner in which timing discrepancy between a reference value and an actual oscillator frequency may be tracked and compensated for.

As mentioned previously, according to some embodiments, a tunable reference oscillator of arbitrary frequency may be used. The frequency may be tuned to an integer value, which, for example, may avoid the need for the counter to perform the accumulator operation described in the example above. Thus, the counter may be simplified to be a pure integer counter using such a technique.

Arbitrary frequency reference oscillators of the type which may be used in real time clocks (e.g., the oscillators 1104 and 1204) may exhibit temperature dependent behavior. In particular, the frequency of the oscillator may vary with temperature. According to an aspect of the present invention, such temperature induced variations may be accounted for in real time clocks utilizing such oscillators. According to one aspect of the present invention, a tunable reference oscillator may be used in connection with a real time clock. For instance, oscillator 1104 and/or oscillator 1204 may be frequency tunable. Accordingly, upon the occurrence of temperature induced variations in the frequency of signals output by those oscillators, a suitable tuning signal may be generated to return the frequency to a desired value. According to another aspect, temperature induced variations in the frequency of reference oscillators utilized in combination with real time clocks may be accounted for by adjusting counter circuitry (e.g., circuitry 1106 or 1206) or a reference value applied to such circuitry (e.g., from memory 1108 and 1208). According to one aspect, frequency tuning of the tunable reference oscillator is combined with adjustment of the counter circuitry and/or reference value to account for temperature induced variations in the reference oscillator operation. Non-limiting examples are now given.

Figure 13:
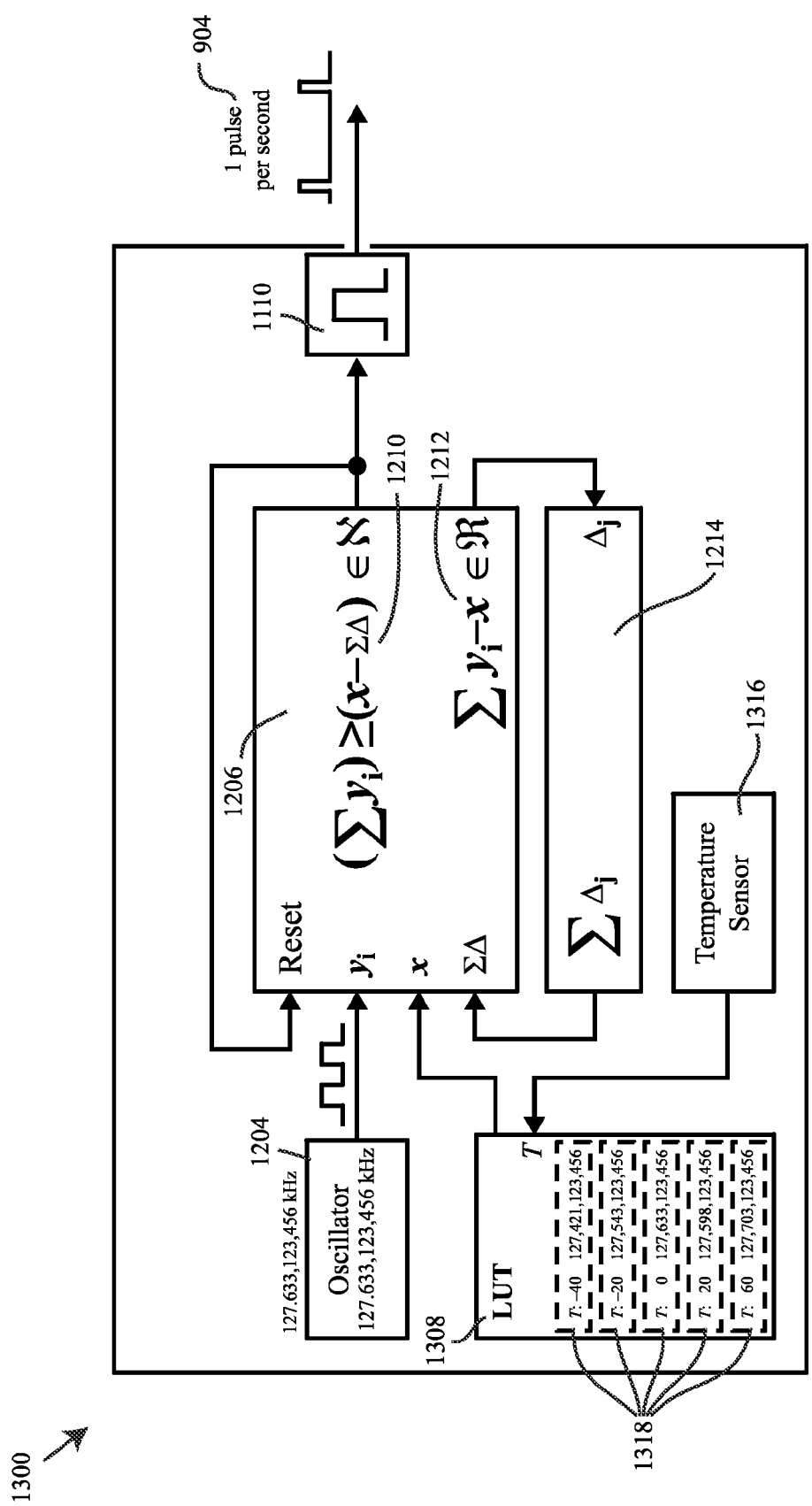
FIG. 13 illustrates a one second period clock using an internal oscillator with arbitrary frequency and additional temperature compensation, according to another embodiment of the present invention.

FIG. 13 illustrates a non-limiting example of a reference clock generator 1300 which may be used in combination with a real time clock (e.g., to provide a reference clock signal to the real time clock), and which is temperature compensated to account for temperature drift of the oscillator 1204. In the non-limiting example illustrated, a temperature sensor 1316 is used in combination with a look-up table (LUT) 1308. The temperature sensor 1316 measures the temperature T. Depending on the value of temperature T, the respective comparison frequency x to serve as the reference value for comparison by the counter and comparator circuitry 1206 to the counted number of oscillations of the output of oscillator 1204 is chosen from the LUT 1308, and in particular from the respective values 1318 stored therein. In this manner, temperature induced variations in the operation of oscillator 1204 may be accounted for. However, it should be understood that the use of the LUT describes only one technique for addressing temperature induced variation of the reference oscillator, and that other techniques are possible.

According to an alternative embodiment, a current or voltage from the temperature sensor 1316 may be used to compute an analog tuning voltage that is applied directly to the oscillator 1204 to frequency tune the oscillator (i.e., to adjust the oscillator frequency). The oscillator may be tuned to an integer arbitrary frequency (e.g., 30 Hz, 50 Hz, etc. or N Hz, where N is an integer), or any other suitable value for facilitating generation of a suitable reference clock signal (e.g., a reference clock signal having a frequency of 1 Hz).

Figure 14:
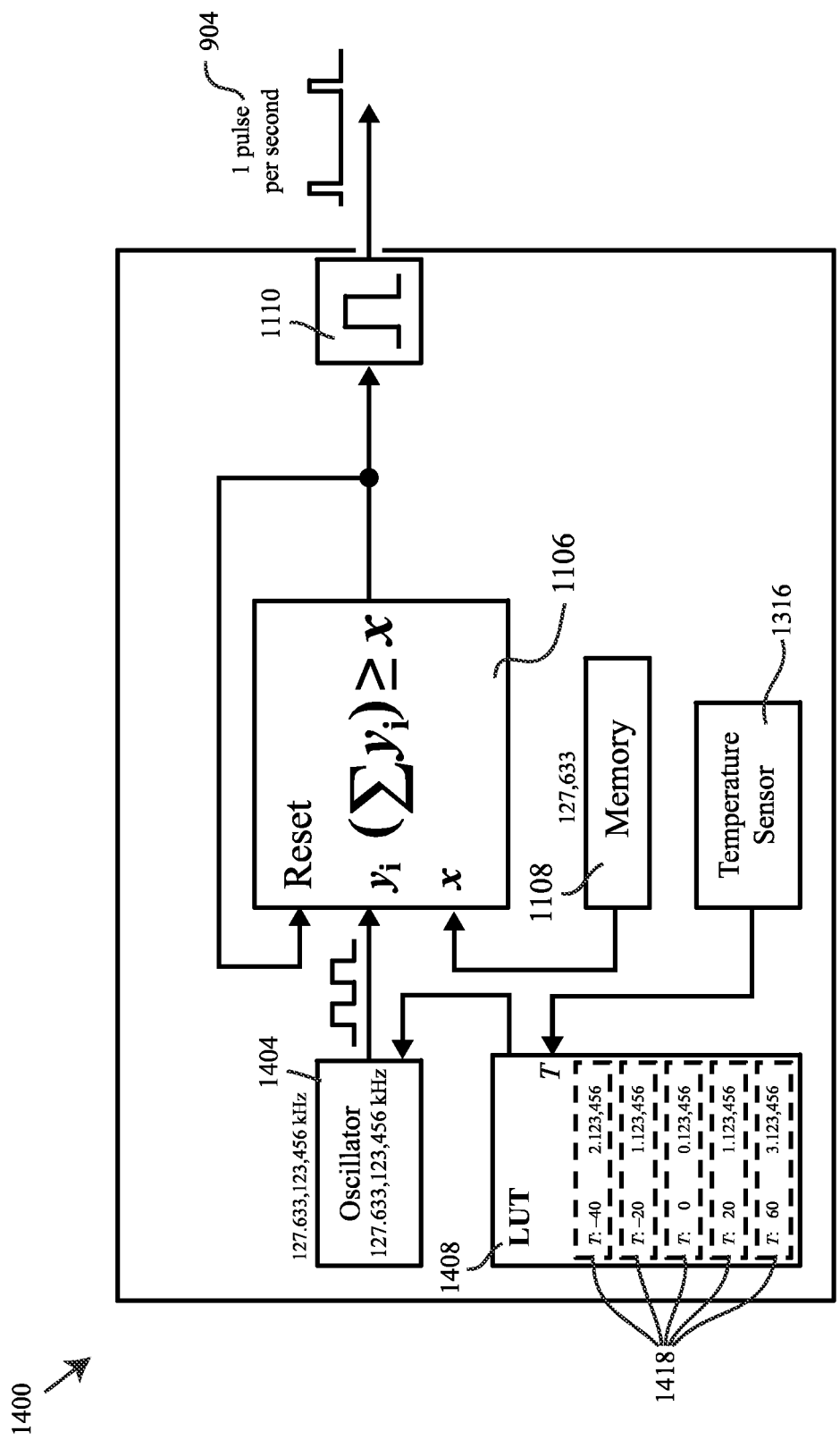
FIG. 14 illustrates a one second period clock using an internal oscillator with arbitrary frequency and additional temperature compensation, according to another embodiment of the present invention.

According to a further alternative embodiment, frequency tuning of the type described above may be combined with use of a LUT as described with respect to LUT 1308. The combination of such techniques may provide improved accuracy and flexibility in addressing temperature induced frequency variations of the oscillator 1204. A non-limiting example is shown in FIG. 14, in which the illustrated reference clock generator 1400 includes a tunable arbitrary frequency reference oscillator 1404 and a LUT 1408. In this example, the illustrated memory 1108 stores and provides to the counter and comparator circuitry 1106 an integer value (i.e., 127,633 in this non-limiting case) that is close to the non-integer arbitrary frequency of the tunable oscillator 1404 (i.e., 127.633,123,456 kHz). The LUT table stores tuning values 1418 which can be applied to the reference oscillator 1404 to tune the reference oscillator to the frequency value from memory 1108 for a given measured temperature from temperature sensor 1316. Thus, the temperature sensor provides a signal to the LUT 1408 indicative of the measured temperature, in response to which a suitable tuning value is chosen and applied to the oscillator 1404. Other manners of addressing temperature induced variations ("temperature drift") are also possible.

Figure 15:
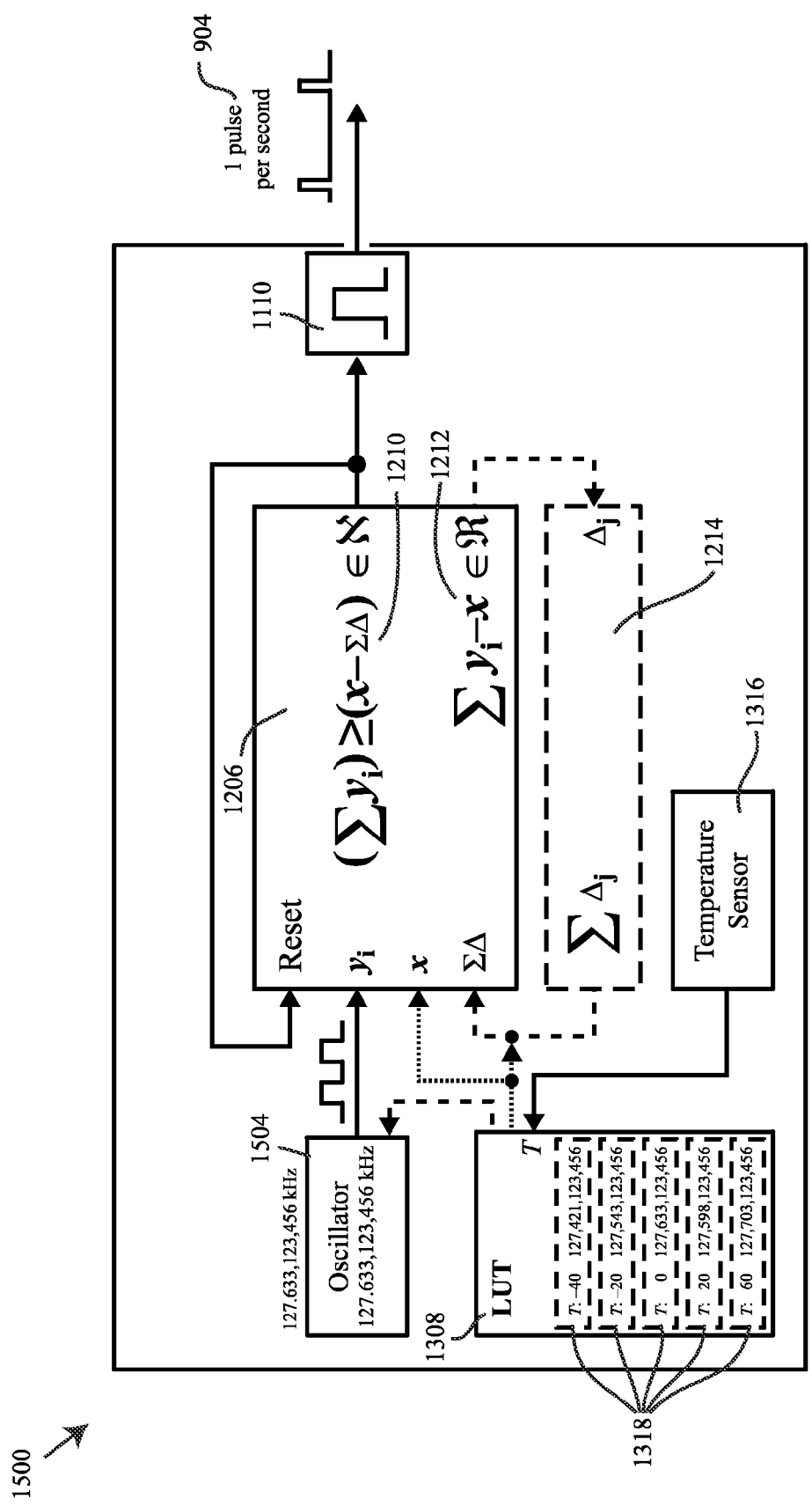
FIG. 15 illustrates a one second period clock using an internal oscillator with arbitrary frequency and optional temperature compensation and error accumulation functionality, according to another embodiment of the present invention.

For instance, a further non-limiting example is illustrated in FIG. 15 with respect to a reference clock generator 1500. As shown, various techniques for maintaining a desired frequency output from an arbitrary frequency oscillator 1504 may be optionally used. Error correction functionality may optionally be provided by the accumulator 1214, as previously described herein (the optional nature is illustrated by the dashed lines). Alternatively, frequency tuning of the arbitrary frequency oscillator may optionally be used in response to a measured temperature, as previously described with respect to FIG. 14 and as indicated by the arrow from the temperature sensor 1316 to the LUT 1308 and the dashed arrow from the LUT 1308 to the oscillator 1504 (the optional nature is indicated by the dashing). Furthermore, the LUT 1308 may optionally supply a reference value x to the counter and comparator circuitry 1206 as a reference value against which to compare a counted number of oscillations of the signal output from the reference oscillator 1504 or as an adjustment to the accumulated error $\Sigma\Delta$, as also shown by the dashed arrows (the optional nature is indicated by the dashing). Any combination of the techniques represented by the dashed arrows in FIG. 15 may be used.

As mentioned, it should be appreciated that the foregoing aspects described with respect to systems and methods for operating upon an oscillating signal having an arbitrary frequency are merely non-limiting examples. Other systems and manners of adapting the configuration and/or operation of the components of the system may be implemented.

Furthermore, while some of the foregoing aspects have been described in the context of cellular telephones, it should be appreciated that they are not limited to such applications. For example, one or more of the aspects may apply to other types of communications systems (e.g., other wireless communications systems, WiFi systems, etc.), as well as to other systems which make use of an oscillating reference signal provided by an oscillator including a mechanical resonator, such as navigation receivers (e.g., GPS receivers), FM receivers, storage systems (e.g., Fibre storage systems, including those using a reference oscillator to generate or operate on an optical signal, etc.), video systems, wireless infrastructure (e.g., WiMax), networking systems (e.g., SPI-4, PCI Express, etc.) or other devices. Thus, it should be appreciated that the foregoing discussion is provided for purposes of illustration, and is not limiting.

Furthermore, it should be appreciated that the various aspects described herein may be used with oscillators and systems designed to provide and operate with any frequency of interest, and that the reference made to 26 MHz in describing various aspects is not limiting, but rather is used for purposes of illustration. For example, the aspects described herein may be used to generate oscillating signals having standard oscillator frequencies of 12 MHz, 12.6 MHz, 13 MHz, 14.4 MHz, 16 MHz, 16.368 MHz, 16.9 MHz, 19.2 MHz, 19.8 MHz, 20 MHz, 23.104 MHz, 24 MHz, 24.554 MHz, 26 MHz, 27 MHz, 27.456 MHz, 32 MHz, 33.6 MHz, 38.4 MHz, 52 MHz, 669.3266 MHz, any other standard oscillator frequency, or any other frequency or frequencies of interest.

It should be appreciated from the foregoing that various benefits may be attained by application of one or more of the described aspects. For example, manufacturing constraints of conventional quartz crystal resonators may be relaxed since such resonators need not provide a precise frequency matching a standard oscillator frequency to operate according to the various aspects described herein. Furthermore, resonator technologies other than conventional quartz crystal resonators may be used even if they are not easily manufactured to provide a precise output frequency matching a standard oscillator frequency. Thus, for example, MEMS resonators having output signal frequencies which may be manufactured to a precision of ±10,000 ppm may be used. Such resonators may provide beneficial characteristics in terms of signal noise (e.g., phase noise among others), reduced spurious modes, improved noise floor, jitter, ruggedness, cost, lower power consumption, and lighter weight, as well as other characteristics.

It should be appreciated that the various aspects of the invention described herein are not limited to use with oscillators employing any particular resonator technology. For example, the various aspects described herein may apply to oscillators using quartz crystal resonators, bulk acoustic wave (BAW) resonators, surface acoustic wave (SAW) resonators, plate acoustic wave (PAW) resonators, (thin) film plate acoustic resonators (FPAR), film bulk acoustic resonators (FBAR), solid mounted resonators (SMR), contour mode resonators (CMR), thin-film piezoelectric on silicon (TPoS), microelectromechanical systems (MEMS) technology, or any other type of resonator technology that uses mechanical vibrations in a solid to excite a resonance frequency and use this as a frequency reference in the oscillator. It should be appreciated that as used herein the term "mechanical resonator" encompasses at least quartz crystal resonators, BAW, SAW, PAW, SMR, FPAR, FBAR, CMR, thin-film piezoelectric on silicon (TPoS) resonator technology, and MEMS resonators. According to some embodiments, the oscillator may include a mechanical resonator comprising or formed of one or more of the following materials: Quartz, Langasite, Silicon, Silicon oxide, Aluminum Nitride, Lithium Tantalate, Lithium Niobate, Zinc oxide, Gallium Arsenide, Cadmium Sulfide, Germanium. Other resonator technologies may also be used.

Having thus described several aspects of at least one embodiment of the technology, it is to be appreciated that various alterations, modifications, and improvements will readily occur to those skilled in the art. Such alterations, modifications, and improvements are intended to be within the spirit and scope of the technology. Accordingly, the foregoing description and drawings provide non-limiting examples only.

What is claimed is:

1. An apparatus, comprising:
an oscillator located on a first semiconductor die and configured to output from the first semiconductor die a first oscillating signal, the first oscillating signal having a first frequency differing from a target frequency for the first oscillating signal by an offset, the oscillator comprising a memory located on the first semiconductor die, the memory being configured to store and output a value identifying the first frequency of the first oscillating signal or the offset; and
a system comprising a frequency synthesizer located on a second semiconductor die, the frequency synthesizer being configured to receive the first oscillating signal from the oscillator located on the first semiconductor die and to generate a second oscillating signal having a second frequency,
wherein the system is configured to receive from the memory located on the first semiconductor die the value identifying the first frequency of the first oscillating signal or the offset, wherein the system is further configured to select a setting of the frequency synthesizer based on the value received from the memory located on the first semiconductor die, and wherein a sub-system of the system is configured to receive the second oscillating signal and is configured to apply a tuning signal to the oscillator.

2. The apparatus of claim 1, wherein the frequency synthesizer is a phase-locked loop (PLL) or a direct digital synthesizer (DDS).

3. The apparatus of claim 2, wherein the first frequency of the first oscillating signal differs from the target frequency by at least 30 parts per million (ppm).

4. The apparatus of claim 3, wherein the first frequency of the first oscillating signal differs from the target frequency by between approximately 1,000 ppm and 10,000 ppm, and wherein the system is configured to select the setting of the frequency synthesizer based on the value received from the memory located on the first semiconductor die such that the second frequency is within approximately 30 ppm of a target frequency for the second frequency.

5. The apparatus of claim 2, wherein the oscillator comprises a mechanical resonator configured to produce the first oscillating signal.

6. The apparatus of claim 2, wherein the frequency synthesizer is a PLL.

7. The apparatus of claim 6, wherein the frequency synthesizer is a fractional PLL.

8. The apparatus of claim 2, wherein the frequency synthesizer is a DDS.

9. The apparatus of claim 2, wherein the value identifying the first frequency of the first oscillating signal or the offset identifies the offset.

10. The apparatus of claim 2, wherein the value identifying the first frequency of the first oscillating signal or the offset identifies the first frequency.

11. The apparatus of claim 2, wherein the system includes a first input port configured to receive from the oscillator the first oscillating signal, and wherein the system further includes a second input port configured to receive from the memory the value identifying the first frequency of the first oscillating signal or the offset.

12. The apparatus of claim 2, wherein the oscillator comprises a mechanical resonator, wherein the system includes a first input port configured to receive from the oscillator the first oscillating signal, and wherein the system further includes a second input port configured to receive from the memory the value identifying the first frequency of the first oscillating signal or the offset, wherein the first frequency of the first oscillating signal differs from the target frequency by between approximately 1,000 ppm and 10,000 ppm, and wherein the system is configured to select the setting of the frequency synthesizer based on the value received from the memory located on the first semiconductor die such that the second frequency is within approximately 30 ppm of a target frequency for the second frequency.

13. The apparatus of claim 12, wherein the frequency synthesizer is a fractional PLL.

* * * * *